(12) United States Patent
Lee

(10) Patent No.: US 12,083,990 B2
(45) Date of Patent: *Sep. 10, 2024

(54) ETHERNET-BASED VEHICLE CONTROL SYSTEM AND METHOD

(71) Applicant: GARIN SYSTEM Co., Ltd., Incheon (KR)

(72) Inventor: Yun Sub Lee, Incheon (KR)

(73) Assignee: GARIN SYSTEM Co., Ltd. (KR)

( * ) Notice: Subject to any disclaimer, the term of this patent is extended or adjusted under 35 U.S.C. 154(b) by 620 days.

This patent is subject to a terminal disclaimer.

(21) Appl. No.: 17/325,153

(22) Filed: May 19, 2021

(65) Prior Publication Data

US 2022/0144211 A1    May 12, 2022

(30) Foreign Application Priority Data

Nov. 12, 2020 (KR) .......................... 10-2020-0150849

(51) Int. Cl.
*B60R 25/20* (2013.01)
*B60R 25/24* (2013.01)
(Continued)

(52) U.S. Cl.
CPC ........ *B60R 25/209* (2013.01); *B60R 25/2072* (2013.01); *B60R 25/24* (2013.01);
(Continued)

(58) Field of Classification Search
CPC ..... B60R 25/04; B60R 25/10; B60R 25/2072; B60R 25/209; B60R 25/24; B60R 25/34; B60R 2025/0405; G07C 5/008; G07C 5/0841; G07C 9/00309; G07C 9/00571; H03M 5/02; H04L 12/40097; H04L 12/40123; H04L 67/12; H04L 67/125; H04L 2012/40273
(Continued)

(56) References Cited

U.S. PATENT DOCUMENTS 5,612,578 A    3/1997 Flick
6,756,885 B1 *  6/2004 Flick .................. G07C 9/00817
(Continued)

FOREIGN PATENT DOCUMENTS

KR    10-2014-0124255 A    10/2014

*Primary Examiner* — Elaine Gort
*Assistant Examiner* — Ellis B. Ramirez

(57) ABSTRACT

Disclosed are Ethernet-based vehicle control system and method. The system includes: a router for connecting a vehicle internal network and a vehicle external network when the vehicle internal network is formed by connecting an engine and a vehicle electronic element including a controller and a sensor; and a remote start module for performing remote start based on a remote start signal transmitted from a remote controller through the vehicle external network, wherein whether or not to perform the remote start is determined based on drive system state information generated by the vehicle electronic element and transferred via the router. When performing a remote start is controlled in response to an engine RPM during the remote start, efficient management of engine protection and fuel consumption can be achieved. When performing a remote start is controlled in response to the position of the transmission, safe remote start can be achieved.

19 Claims, 17 Drawing Sheets

(51) Int. Cl.
  *B60R 25/34* (2013.01)
  *G07C 5/00* (2006.01)
  *H03M 5/02* (2006.01)
  *H04L 67/12* (2022.01)
  *H04L 67/125* (2022.01)

(52) U.S. Cl.
  CPC ............ *B60R 25/34* (2013.01); *G07C 5/008* (2013.01); *H04L 67/12* (2013.01); *H04L 67/125* (2013.01); *H03M 5/02* (2013.01)

(58) Field of Classification Search
  USPC .................... 701/2, 24; 340/426.13, 426.15; 307/10.6; 180/167
  See application file for complete search history.

(56) References Cited

U.S. PATENT DOCUMENTS

| | | | |
|---|---|---|---|
| 2005/0179322 A1* | 8/2005 | Flick | B60R 25/20 |
| 2005/0263120 A1* | 12/2005 | Fifelski | B60R 25/209 |
| 2008/0287074 A1* | 11/2008 | Grunhold | H04M 1/6091 |
| 2009/0079552 A1* | 3/2009 | Flick | B60R 25/24 |
| 2018/0118050 A1* | 5/2018 | Choi | G05D 1/0022 |
| 2018/0118186 A1* | 5/2018 | Yi | B60L 58/20 |
| 2018/0304836 A1* | 10/2018 | DeCia | H04B 1/3822 |
| 2021/0114605 A1* | 4/2021 | Kuang | B60W 30/192 |

* cited by examiner

ETHERNET-BASED VEHICLE CONTROL SYSTEM AND METHOD

CROSS-REFERENCE TO PRIOR APPLICATIONS

This application claims priority of Korean Patent Application No. 10-2020-0150849, filed on Nov. 12, 2020, which is hereby incorporated by reference in its entirety.

BACKGROUND OF THE INVENTION

Field of the Invention

The present invention relates to a vehicle control technique. More specifically, the present invention relates to an Ethernet-based vehicle control system and method, for controlling whether or not to perform remote start in response to driving system state information including an engine RPM or a transmission position in an Ethernet-based vehicle.

Background of the Related Art

Bosch Co., located at Gerlingen, Germany, has developed a Controller Area Network (CAN) for constructing an efficient vehicle internal network. The CAN provides an economical and stable network since it can control a plurality of modules with one interface. In addition to the CAN, an extended CAN that increases the data transmission rate by adding an ID has been proposed. CAN communication is performed in a way of processing broadcast information by a corresponding vehicle electronic element while the vehicle electronic element is connected to the CAN bus. For example, when a corresponding ECU broadcasts a door open signal to the CAN bus in response to pressing a door open button of a vehicle remote control key, a door lock module related to the door open signal performs door open operation. However, the other vehicle electronic elements unrelated to the door open signal bypass the door open signal. Meanwhile, the CAN has been developed in a very closed environment due to the specificity of being applied to vehicles, and techniques for integrating the CAN with a vehicle external network are proposed to compensate for this shortcoming.

On the other hand, as the functions of vehicles are advanced, various electronic control units (ECUs) are continuously mounted, and network complexity of vehicles increases. That is, as the vehicles change from mechanical types to electronic types, the number of electronic control units, controllers, sensors, and the like mounted on the vehicles increases. Accordingly, it is difficult to quickly and stably process signals using the communication speed and bandwidth of the CAN. Although FlexRay® Network Communication Protocol, which is mainly used for brake systems and cruise controls, has been proposed to solve this problem, there are problems such as increase in the number of connecting lines and increase in development cost.

Therefore, Ethernet for vehicles is spotlighted as an alternative to the FlexRay. Ethernet for vehicles presents infinite possibility of connected cars. The Ethernet may transmit and receive a large amount of data and also develop the vehicle infotainment environment greatly. In addition, the Ethernet for vehicles may be regarded as a prerequisite condition for operating an advanced driver assistance system (ADAS) of connected cars, autonomous vehicles or the like. In addition, it may be easy to additionally install electronic equipment of various functions in the Ethernet-based vehicle. That is, genuine electronic control units, controllers, sensors, and the like may be replaced for management of vehicles, and in addition, a separate third-party module may be added to support various functions (here, the third-party module means equipment manufactured in accordance with a specification provided by developers other than the companies officially developing hardware or software).

However, although a vehicle may be controlled (for example, remote start) in a way of bypassing the ECU when a third-party module is installed in an existing vehicle based on the CAN, when connected cars, autonomous vehicles or the like are implemented based on the Ethernet, security functions that block hacking or the like from vehicle external networks will be strengthened through a gateway, and therefore, operation of the third-party module may be blocked or even disabled.

On the other hand, the remote start presented as an example of the vehicle control described above may be used to heat up the engine in a cold climate, increase room temperature by operating a heater, lower the room temperature by operating an air conditioner, or simply promote user's convenience.

However, as described above, it may be difficult to apply an aftermarket remote start system to an Ethernet-based vehicle. In addition, there is a difficulty of adding an application in the case of remote start using an aftermarket remote start system. Moreover, since the remote start may require specific conditions of a vehicle, precise control should be performed before starting the engine and while running the engine in an unmanned state. In addition, the remote start system may interface with one or more vehicle controllers, such as engine management control and transmission control, however, it may not be compatible with other models, model years, and manufacturers although it is suitable for a specific model, model year, and manufacturer.

SUMMARY OF THE INVENTION

Therefore, the present invention has been made in view of the above problems, and it is an object of the present invention to provide an Ethernet-based vehicle control system and method, which can achieve smooth driving of a third-party module through verification, clone or the like of a Media Access Control (MAC) address in response to addition of the third-party module in a vehicle based on the Ethernet.

In addition, another object of the present invention is to provide an Ethernet-based vehicle control system and method, which allows to control whether or not to perform remote start in response to drive system state information including an engine RPM or a transmission position when a remote start system is added as a third-party module.

To accomplish the above objects, according to one aspect of the present invention, there is provided an Ethernet-based vehicle control system comprising: a router for connecting a vehicle internal network and a vehicle external network when the vehicle internal network is formed by connecting an engine and a vehicle electronic element including a controller and a sensor; and a remote start module for performing remote start based on a remote start signal transmitted from a remote controller through the vehicle external network, wherein whether or not to perform the remote start is determined based on drive system state information generated by the vehicle electronic element and transferred via the router.

At this point, the remote start module may include: a remote start receiver for receiving the remote start signal transmitted from the remote controller through the vehicle external network; and a remote start controller for controlling engine start by an engine speed signal received from at least one vehicle electronic element that senses an engine speed among the drive system state information, the remote start signal, and a virtual signal randomly generated in connection with remote start.

Here, the Ethernet-based vehicle control system may further comprise an engine speed data reader installed between the remote start controller and the router to detect the engine speed and generate the engine speed signal. At this point, the engine speed data reader may read a digital code of the engine speed signal and convert the digital code into a pulse-type tachometer emulation signal, and the remote start controller may operate the engine based on the remote start signal and the pulse-type tachometer emulation signal. In addition, the engine speed data reader may read a digital code of the engine speed signal and convert the digital code into at least one output value based on the digital code reaching at least one threshold value, and the remote start controller may operate the engine based on the remote start signal and the at least one output value. In addition, the remote start controller may start the engine based on a tachometer emulation signal reaching an engine start threshold value within a range corresponding to engine revolution of 50 to 1,000 per minute, and stop the engine based on a tachometer emulation signal reaching an engine overspeed threshold value corresponding to engine revolution of 2,500 or more per minute.

Meanwhile, the remote start module may include: a remote start receiver for receiving the remote start signal transmitted from the remote controller through the vehicle external network; and a remote start controller for controlling engine start by a transmission position data received from at least one vehicle electronic element related to a transmission position among the drive system state information, the remote start signal, and a virtual signal randomly generated in connection with remote start.

At this point, the remote start controller may allow engine start only when a transmission is in a preset position, and the preset position may be a Park position.

In addition, the router may further include at least one sensor related to security, wherein the remote start module may control remote start by combining security data generated by the at least one sensor related to security.

In addition, the remote controller may include a remote handheld transmitter carried by a user when the user is away from the vehicle.

In addition, the remote start module may perform any one among a process of converting a packet transmitted from the vehicle external network into a signal required by the vehicle electronic element in response to the packet and transmitting the signal to the vehicle electronic element so that the vehicle electronic element performs a corresponding operation, a process of directly controlling a corresponding vehicle electronic element in response to the packet transmitted from the vehicle external network, a process of bypassing input and output packets to the vehicle electronic element or the vehicle external network as they are, and a process of ignoring a packet output from the vehicle electronic element and modulating and transmitting a corresponding packet to the vehicle electronic element and the vehicle external network, or deleting a packet input into the vehicle electronic element and modulating and transmitting a corresponding packet to the vehicle electronic element.

Meanwhile, an Ethernet-based vehicle control method is applied to an Ethernet-based vehicle control system comprising a router for connecting a vehicle internal network and a vehicle external network when the vehicle internal network is formed by connecting an engine and a vehicle electronic element including a controller and a sensor, and the method may comprise the steps of: transmitting drive system state information generated by the vehicle electronic element to the router in response to a drive system state; reading the drive system state information from a reader connected to the router; and performing remote start by a remote start module in response to a remote start signal transmitted from a remote controller through the vehicle external network, and whether or not to perform the remote start is determined based on the drive system state information generated by the vehicle electronic element and transferred via the router.

At this point, the drive system state information may be an engine speed signal received from at least one vehicle electronic element that senses an engine speed, the reader may be an engine speed data reader for reading the engine speed signal, the engine speed signal may include a digital code, and the engine speed data reader may read the digital code and convert the digital code into a pulse-type tachometer emulation signal for a remote start controller.

In addition, the drive system state information may be an engine speed signal received from at least one vehicle electronic element that senses an engine speed, the reader may be an engine speed data reader for reading the engine speed signal, the engine speed signal may include a digital code, and the engine speed data reader may read the digital code and convert the digital code into at least one output value for a remote start controller.

In addition, the remote start controller may start the engine based on an engine start output value when the at least one output value includes the engine start output value based on a tachometer emulation signal or the digital code reaching an engine start threshold value within a range corresponding to engine revolution of 50 to 1,000 per minute, and stop the engine based on an engine overspeed output value when the at least one output value includes the engine start output value based on a tachometer emulation signal or the digital code reaching an engine overspeed threshold value corresponding to engine revolution of 2,500 or more per minute.

Meanwhile, at the step of determining whether or not to perform remote start, engine start may be controlled by further combining a virtual signal randomly generated in connection with remote start.

In addition, the drive system state information may be a transmission position data received from at least one vehicle electronic element related to a transmission position, and the remote start module may allow engine start only when a transmission is in a preset position, and the preset position may be a Park position.

In addition, the remote start module may perform any one among a process of converting a packet transmitted from the vehicle external network into a signal required by the vehicle electronic element in response to the packet and transmitting the signal to the vehicle electronic element so that the vehicle electronic element performs a corresponding operation, a process of directly controlling a corresponding vehicle electronic element in response to the packet transmitted from the vehicle external network, a process of bypassing input and output packets to the vehicle electronic element or the vehicle external network as they are, and a process of ignoring a packet output from the vehicle electronic element and modulating and transmitting a corresponding packet to the vehicle electronic element and the vehicle external network, or deleting a packet input into the vehicle electronic element and modulating and transmitting a corresponding packet to the vehicle electronic element.

DESCRIPTION OF SYMBOLS

Figure 1:
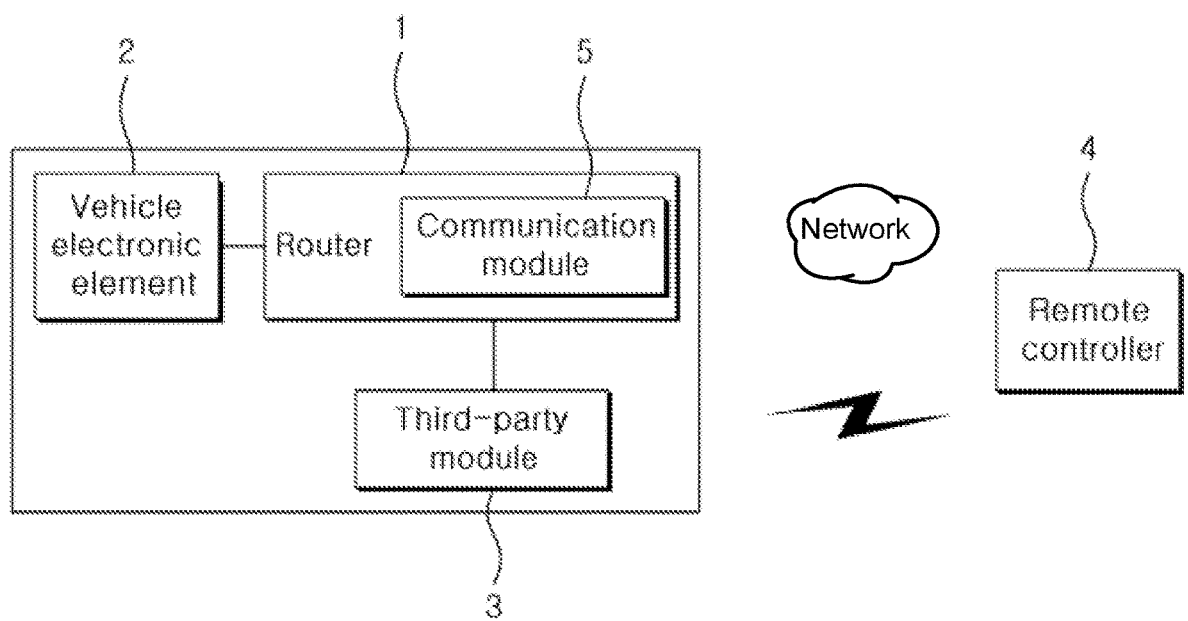
FIG. 1 is a conceptual view showing an Ethernet-based vehicle control system according to a first embodiment of the present invention.

1: Router
2: Vehicle electronic element
3: Third-party module
4: Remote controller
5, 6: Communication module

DETAILED DESCRIPTION OF THE PREFERRED EMBODIMENT

Hereinafter, the present invention will be described in detail with reference to preferred embodiments of the present invention and the accompanying drawings, and it will be described on the premise that the same reference numerals refer to the same components.

In the detailed description or claims of the present invention, when any one component "includes" another component, it is not construed as being limited to only the component unless otherwise stated, and it should be understood that the component may further include other components.

In addition, in the detailed description or claims of the present invention, the components named as "~means", "~unit", "~module", or "~block" refer to units that process at least one or more functions or operations, and each of these components may be implemented by software, hardware, or a combination of these.

Hereinafter, an example in which the Ethernet-based vehicle control system and method of the present invention is implemented will be described through a specific embodiment.

FIG. 1 is a view showing the configuration of an Ethernet-based vehicle control system according to a first embodiment of the present invention.

Referring to FIG. 1, an Ethernet-based vehicle control system of the present invention basically includes a router 1 for connecting a vehicle internal network and a vehicle external network based on Ethernet, and a vehicle electronic element 2 connected to and communicating with the router 1, and in the present invention, a third-party module 3 newly mounted on the vehicle to perform a corresponding function through an interface with the vehicle electronic element 2 passing through the router 1 is included.

Meanwhile, the router 1 may include a communication module 5 for communicating with a remote controller 4 through the vehicle external network. As the communication module 5, a short-range communication module including Wi-Fi, Bluetooth, ZigBee, short-range RF and the like and a mobile communication module including GSM/GPRS, UMTS/WEDGE/HSDPA, CDMA and the like may be selectively used. Here, that the router 1 includes the communication module 5 includes that the communication module 5 is connected to the router 1.

The vehicle electronic element 2 is an electronic equipment part that is set in a genuine state for each trim level when the vehicle is manufactured, and includes an electronic control unit (ECU), controllers, sensors and the like for controlling the transmission, door locks and the like which basically constitute the vehicle. In this way, an engine and the vehicle electronic element 2 including a controller, a sensor and the like are connected to the router 1 to form a vehicle internal network.

For example, in the case of a trim level that does not include a remote start controller as an option, a remote start module may be added as a separately and newly mounted third-party module 3. Here, the remote start module may include a remote start controller and a communication module 5, and the remote controller 4 may be further included as an option. In addition, the remote start module performs remote start by a remote start signal transmitted from the remote controller through the vehicle external network, and whether or not to perform remote start may be determined based on an engine speed signal generated by the vehicle electronic element 2 and transferred via the router 1 or based on drive system state information including transmission position data.

Figure 2:
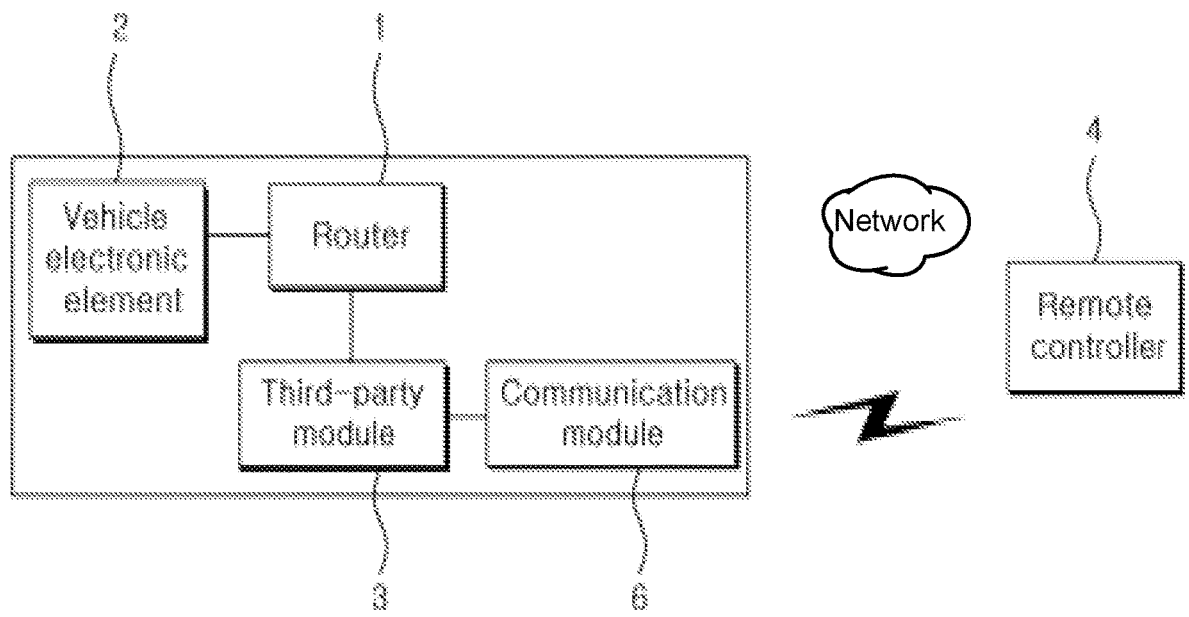
FIG. 2 is a conceptual view showing an Ethernet-based vehicle control system according to a second embodiment of the present invention.

FIG. 2 is a view showing the configuration of an Ethernet-based vehicle control system according to a second embodiment of the present invention.

Hereinafter, duplicate description of the same configuration and configurations performing the same function will be omitted in the description of drawings.

Referring to FIG. 2, compared with the Ethernet-based vehicle control system of FIG. 1, the difference is that a communication module 6 for third-party module, which communicates with the remote controller 4 through the vehicle external network, is connected to the third-party module 3. That is, compared with the first embodiment described above, the router 1 proposed in this embodiment may not include a communication module.

Figure 3:
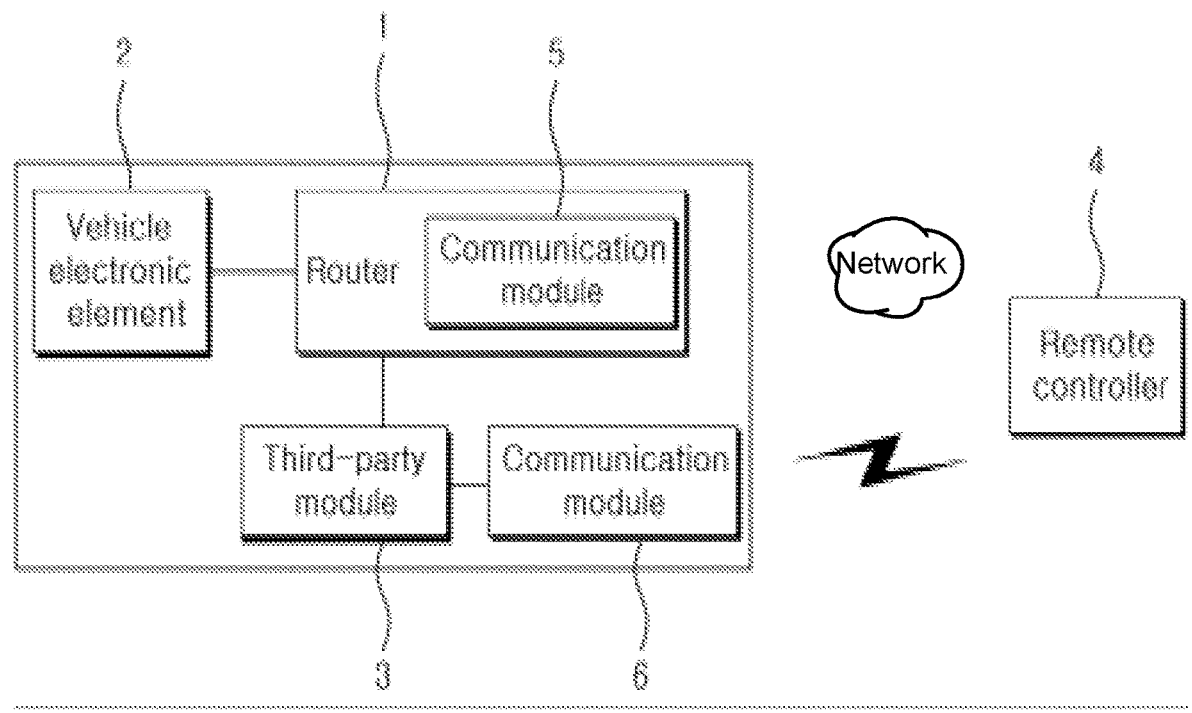
FIG. 3 is a conceptual view showing an Ethernet-based vehicle control system according to a third embodiment of the present invention.

FIG. 3 is a view showing the configuration of an Ethernet-based vehicle control system according to a third embodiment of the present invention.

Referring to FIG. 3, compared with the Ethernet-based vehicle control system of FIG. 1, a communication module 6 for third-party module, which communicates with the remote controller through the vehicle external network, may be additionally connected to the third-party module 3.

For example, the communication module 5 included in the router 1 proposed in this embodiment may use a mobile communication network while the vehicle travels, and the communication module 6 for third-party module may use a local area network in a parking state. Of course, the method of using the communication module 5 included in the router 1 and the communication module 6 for third-party module may be randomly selected and controlled by the user.

Meanwhile, although a case in which the vehicle electronic element 2 and the third-party module 3 proposed in the first to third embodiments are individually connected to the router 1 is described, the third-party module 3 may be formed between the vehicle electronic element 2 and the router 1. Through the configuration like this, the third-party module 3 may perform four functions described below.

First, the third-party module 3 may convert a packet transmitted from the vehicle external network into a signal required by the vehicle electronic element 2 and transmit the signal to the vehicle electronic element 2 so that the vehicle electronic element 2 may perform a corresponding operation.

Second, the third-party module 3 may directly control the vehicle electronic element 2 in response to a packet transmitted from the vehicle external network.

Third, the third-party module 3 may bypass input and output packets to the vehicle electronic element 2 and the vehicle external network as they are.

Fourth, the third-party module 3 may ignore the packets output from the vehicle electronic element 2 and modulate and transmit corresponding packets to the vehicle electronic element 2 and the vehicle external network, or contrarily, the third-party module 3 may delete the packets input into the vehicle electronic element 2 and modulate and transmit corresponding packets to the vehicle electronic element 2.

At this point, the third-party module 3 may communicate using a communication module of the access method proposed in the first to third embodiments described above.

As all the data transmitted and received between the vehicle electronic element 2 and the router 1 pass through the third-party module 3 in this way, the third-party module 3 may control the input and output signals. That is, the third-party module 3 may convert a packet to match a corresponding vehicle in response to a request signal, directly control a corresponding vehicle electronic element 2 by cloning the MAC address of the vehicle electronic element 2 in response to a request signal, bypass input and output signals, or override input and output signals.

Meanwhile, for example, a remote start module may be mounted as the third-party module 3 proposed in the first to third embodiments described above. That is, when a remote start function is not included in the trim level of a vehicle, the remote start module may be installed in the vehicle later. In response to installation of the remote start module, the remote start module broadcasts a search message to the router 1. At this point, the search message includes a MAC address and information related to remote start. Accordingly, the router 1 assigns an IP address in response to the received search message, and broadcasts an IP providing message to the remote start module. The IP providing message may include the MAC address, the assigned IP address, the IP address of the router 1, and the like. A process of registering the MAC address in the router 1 is performed in this way, and accordingly, the router 1 may perform routing corresponding to input and output signals based on a MAC address table in which the relation with previously registered MAC addresses is established.

Here, although it may vary according to the trim level of a vehicle, generally, a vehicle may start only when a vehicle remote control key is located inside the vehicle. However, when the remote start module is mounted, remote start should be allowed although the vehicle remote control key is not located inside the vehicle.

Accordingly, when it is desired to use an engine speed signal, it may be performed in the following process. When a remote start signal is transmitted through the vehicle external network, the remote start module arbitrarily generates a virtual signal indicating that the vehicle remote control key is recognized inside the vehicle, a virtual signal indicating that the start button is pressed by the vehicle remote control key, and a virtual signal indicating that the transmission is at a specific position (e.g., Park), and informs the vehicle electronic element 2 of the virtual signals although the vehicle remote control key is not located inside the vehicle. At this point, the remote start module also informs the vehicle electronic element 2 of the engine speed signal read through an engine speed data reader.

In addition, when it is desired to use the transmission position data, it may be performed in the following process. When a remote start signal is transmitted through the vehicle external network, the remote start module arbitrarily generates a virtual signal indicating that the vehicle remote control key is recognized inside the vehicle and a virtual signal indicating that the start button is pressed by the vehicle remote control key and informs the vehicle electronic element 2 of the virtual signals although the vehicle remote control key is not located inside the vehicle. At this point, the remote start module also informs the vehicle electronic element 2 of transmission position data indicating that the transmission is at a specific position (e.g., Park).

Accordingly, start control by the vehicle electronic element 2 will be performed. That is, the remote start module arbitrarily generates a signal basically including the drive system state information including a remote start signal, an engine speed signal or transmission position data and indicating that the vehicle remote control key is recognized inside the vehicle and the start button is pressed by the vehicle remote control key, and inform the generated signal to the vehicle electronic element 2 related to remote start in response to the remote start signal.

At this point, in the present invention, in order to enhance security, when the remote start module transmits a packet (command signal) on the Ethernet, other vehicle electronic elements 2 of the vehicle internal network may confirm the MAC address and check whether a registered vehicle electronic element 2 has transmitted the packet. To this end, the remote start module may use a method such as cloning the MAC address. Of course, the security may also be enhanced in other ways.

Hereinafter, a specific embodiment of the Ethernet-based vehicle control system of the present invention will be described, and in this embodiment, a case of applying the remote start module to the Ethernet-based vehicle control system as the third-party module 3 will be described. In addition, for convenience of explanation, it will be described based on the configuration of the first embodiment of FIG. 1. Of course, it is natural that various systems other than the remote start module may be applied to the present invention.

Figure 4:
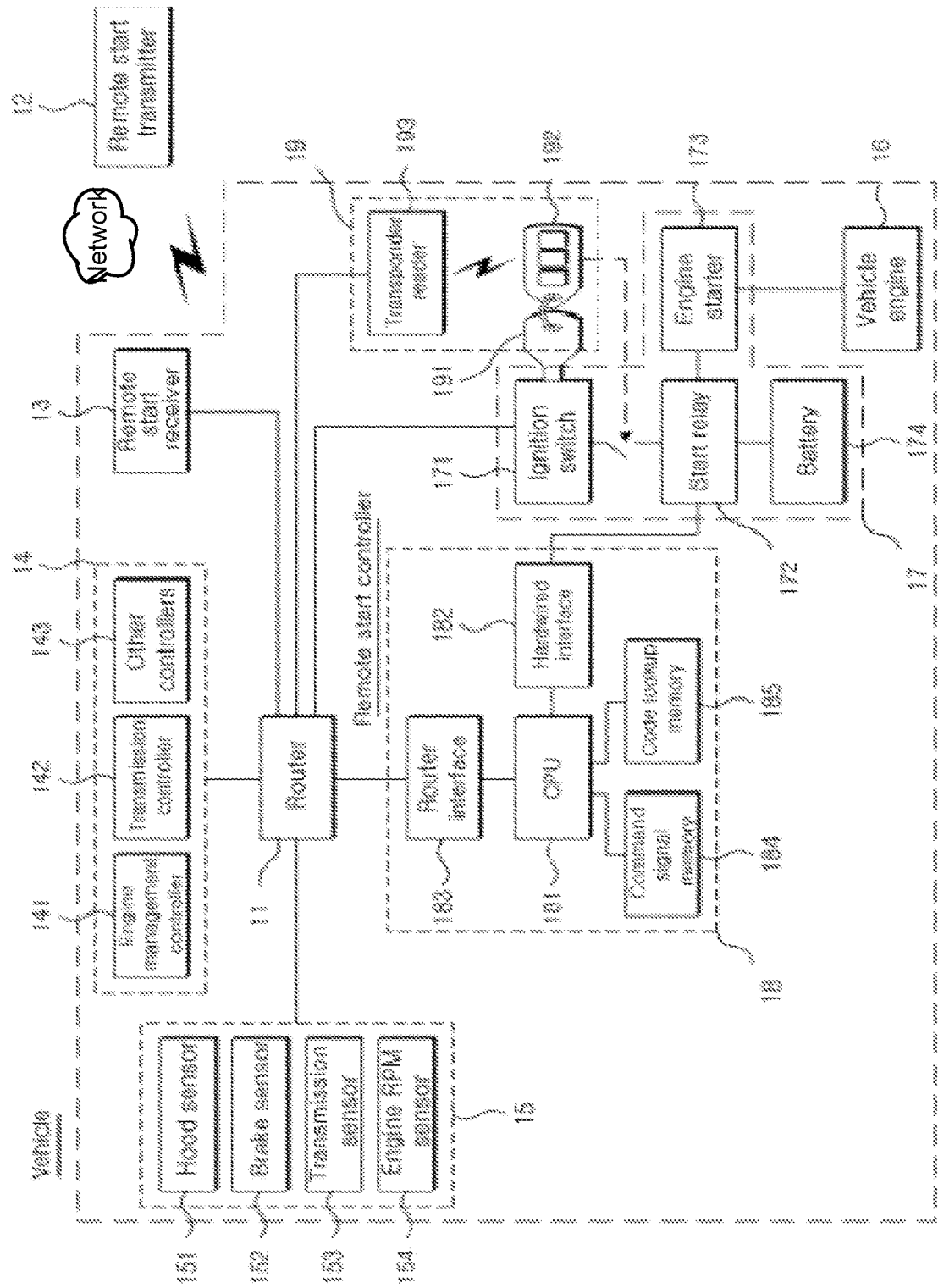
FIG. 4 is a block diagram showing a control circuit of an Ethernet-based vehicle control system including a remote start module as a first application example of the present invention.

FIG. 4 is a block diagram showing a control circuit of an Ethernet-based vehicle control system including a remote start module as a first application example of the present invention.

Referring to FIG. 4, the vehicle control system illustrated in the present invention operates based on the Ethernet, and thus a router 11 connecting a vehicle internal network and a vehicle external network is basically installed in the vehicle.

Accordingly, a remote start receiver 13 for receiving a signal transmitted from a remote start transmitter 12 through short-range communication or mobile communication, a controller group 14 for controlling vehicle electronic elements, a sensor group 15 for sensing vehicle states, an engine start circuit 17 for starting a vehicle engine 16, and a remote start controller 18 for controlling engine start may be connected to the router 11.

As described, the remote start controller 18 is connected to the router 11 to communicate with at least one or more vehicle electronic elements. That is, as the remote start controller 18 is connected to the remote start receiver 13 through the router 11, start of the vehicle is possible in response to a signal transmitted from the remote start transmitter 12. Meanwhile, in this embodiment, although the remote start receiver 13 responding to a signal transmitted from the remote start transmitter 12 is illustrated as an example, the remote start receiver 13 may perform the function of the communication module 5 of FIG. 1.

Remote start means initially starting the vehicle engine 16 and maintaining an idle state even when the vehicle owner is absent. In addition, whether the remote start controller 18 is able to allow start of engine and continue idling may be based on a plurality of predetermined conditions in the vehicle. Corresponding conditions will be described below in detail.

Meanwhile, the controller group 14 related to start of the vehicle engine 16 may include at least one controller such as an engine management controller 141 or a transmission controller 142. In addition, one or more other controllers 143 may communicate with the remote start controller 18.

In addition, optionally or additionally, the sensor group 15 related to start of the vehicle engine 16 may include at least one vehicle sensor 151 to 154. For example, the vehicle sensors 151 to 154 may be at least one among a hood sensor 151, a brake sensor 152, a transmission sensor 153, and an engine speed (RPM) sensor 154. In addition, other sensors related to remote start may also be applied.

The remote start controller 18 includes a central processing unit (CPU) 181 capable of performing signal processing and logic functions needed to control starting, subsequent driving or shutting-down of the vehicle engine 16. For example, the vehicle engine 16 may be prevented from being started or stopped when the gear shift lever is in a position other than the Park or when a gear shift is made. Similarly, the engine may be shut down when the engine RPM exceeds a predetermined value. In addition, an engine starter 173 may operate only up to an engine RPM indicating that the engine is started. When the vehicle hood is open, operation or stopping of the vehicle engine 16 may be prevented. In addition, many other vehicle states may be taken into account by the remote start controller 18.

Generally, a vehicle includes the engine start circuit 17 shown in the lower right part of FIG. 4. The engine start circuit 17 may include an ignition switch 171, a start relay 172 connected to the ignition switch 171, and a vehicle battery 174 for supplying power to the engine starter 173.

The vehicle may also include a security immobilizer circuit 19 connected to the engine start circuit 17 as shown in the figure. The security immobilizer circuit 19 includes, for example, a passive transponder 192 carried in the neighborhood of an ignition key 191, and a transponder reader 193 for supplying power and reading coded signals from the passive transponder 192. Since such a security immobilizer circuit 19 is a well-known technique, detailed description thereof will be omitted. The remote start controller 18 may include a hardwired interface 182 connected to the immobilizer to bypass this circuit when remote start is needed. Accordingly, the engine start circuit 17 may be activated in response to presentation of a properly coded passive transponder 192 in the proximity of the transponder reader 193.

Of course, other types of security immobilizer circuits 19 may be used in other embodiments. For example, engine ignition may be deactivated by the engine management controller 141 unless a predetermined packet is generated by the transponder reader 193 and delivered to the router 11. In such a system, a packet may be generated through a router interface 183 of the remote start controller 18 so that drive of the transponder immobilizer may be effectively bypassed. The router interface 183 includes a circuit for interfacing in an appropriate signal level and format to perform Ethernet-based communication.

In another example, the coded resistor key approach described in U.S. Pat. Registration No. 5,612,578 allows remote start in a way of selectively bypassing by the remote start controller 18. Other security immobilizer circuits 19 and devices may also be easily bypassed to enable the remote start.

The remote start transmitter 12 may be a small portable unit including a housing, a function control switch installed in the housing to be carried, a battery installed in the housing, and a related transmitter circuit. That is, the remote start transmitter 12 may be a remote handheld transmitter that can be carried by a user when the user is away from the vehicle. Communication from the remote start transmitter 12 to the remote start receiver 13 in a vehicle is generally performed over a direct radio frequency link, i.e., has no intervening communication link. However, in other embodiments, the remote start transmitter 12 and the remote start receiver 13 may indirectly communicate through another communication infrastructure such as satellite or cellular communication, public switched telephone network (PSTN), or the World Wide Web or the Internet as described above.

In addition, the remote start transmitter 12 may include one or more base station transmitters that can be provided by, for example, a satellite transmitter or a cellular phone transmitter. Such base station transmitters may also be connected to other communication infrastructures.

In some embodiments, the Ethernet-based vehicle control system may optionally include a remote receiver (not shown) in the form of a small handheld device carried by a user or at least one base station receiver cooperating with a remote transmitter (not shown) in the vehicle to provide state information to the user in connection with remote start.

In the Ethernet-based vehicle control system shown in the figure, it is shown that various sensors 151 to 154 are connected to and communicated with the router 11. However, in another embodiments, one or more of these sensors may be applied to various controllers 141 to 143 that may have its own hardwired interface 182 for a specific signal or function.

The remote start controller 18 includes one or more memories 184 and 185 connected to the CPU 181. Although the memories 184 and 185 are shown as separate devices, the memories may be combined as a single device. Alternatively, the memories may be embedded in an integrated circuit the same as the processing circuit of the CPU 181.

Meanwhile, as another embodiment of the present invention, compatibility with other types of vehicles may be provided. Like this, the remote start controller 18 may have a feature capable of functioning as a multi-vehicle compatible remote start controller 18. The remote start controller 18 having these optional features may generate at least one command signal set for at least one vehicle electronic element. The one or more command signal sets may include one or more operation command signals and one or more non-operation command signals for a given vehicle to provide command compatibility with a plurality of different vehicles.

In addition, in order to read the communication from the vehicle electronic element, the remote start controller 18 may stores a series of device codes for a given vehicle electronic element for a plurality of different vehicles, and the router 11 may confirm the code of a corresponding vehicle electronic element and determine whether or not the code matches. Compatibility with a plurality of different vehicles is provided between the read device code and the stored device code. Here, the Media Access Control (MAC) address may be used as the device code.

Figure 5:
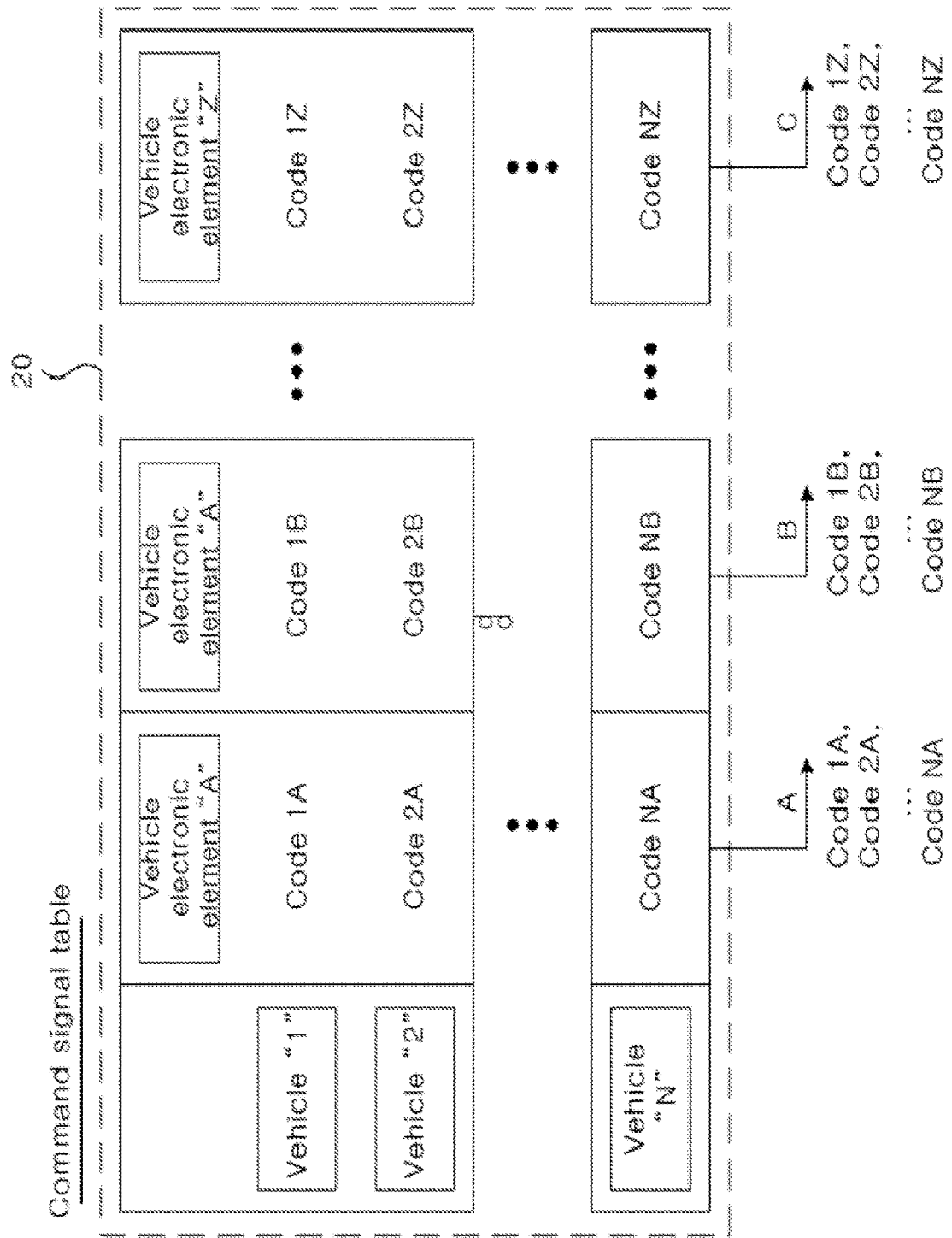
FIG. 5 is a view showing a command signal table generated by a router in the remote start module of FIG. 4.

A vehicle includes a plurality of electrical and electronic devices 141 to 143 and 151 to 154 that can be controlled, and/or their states may be read through the router 11. The remote start controller 18 may provide multi-vehicle compatibility through unidirectional or bidirectional communication using the router 11. In FIG. 5, the process of driving or generating a communication signal by the router 11 will be described in detail. The remote start controller 18 includes, for example, a command signal memory 184, and a router interface 183 capable of providing bidirectionality of communication.

According to an embodiment of the present invention, the remote start controller 18 preferably generates at least one command signal set in the router 11 for at least one vehicle electronic element. The one or more command signal sets preferably include one or more operation command signals and one or more non-operation command signals for a given vehicle to provide compatibility with a plurality of different vehicles. In other words, a plurality of signals or codes may be generated by the router 11, and only a code for a given vehicle and device may allow an operation or a response from the vehicle electronic element. This provides comparatively simple and direct access for interfacing or cooperating with a vehicle having the router 11, and the remote start controller 18 is easily compatible with a plurality of different vehicles. Typically, since it is preferable to interface with a plurality of vehicle electronic elements, the remote start controller 18 may generate a command signal set for each vehicle electronic element.

The multi-vehicle compatibility provided by the remote start controller 18 is particularly easy in an aftermarket remote start system. The interface capability through the router 11 also significantly reduces complexity of wiring needed for interfacing with related vehicle electronic elements.

The remote start controller 18 may sequentially generate different command signals (active and inactive) for intended vehicle electronic elements. For example, in order to guarantee effective communication even when a noise exists, the remote start controller 18 may generate a command signal set as many as a plurality of times, e.g., 2 to 5 times. In order to communicate effectively, it needs to be balanced with traffic congestion in the router 11 as much as possible.

Now, it will be described in detail with reference to the diagram of FIG. 5. In FIG. 5, the operation of the remote start controller 18 is additionally described. The remote start controller 18 may operate by arranging a common table 20 in the command signal memory 184 as shown in the figure. For example, when it is determined that an operation such as activating the start relay 172 needs to be performed, the CPU 181 will identify an appropriate column among the column marked as "Vehicle Electronic Element A" to the column marked as "Vehicle Electronic Element Z" in the table 20. For example, the appropriate column may be "Vehicle electronic element B", and in this case, the CPU will read the memory location of this column to generate an appropriate code set for the router 11 to operate the start relay 172 for each of N vehicles. Of course, only one of the codes will be an operating code, and the other codes will not perform a corresponding vehicle function. For example, when a vehicle in which the remote starting controller 18 is installed is a remotely started vehicle, only code 2B will operate the start relay 172.

Actually, a coded signal may be compatible with a specific router 11. The code may be a binary code, and to more easily express for convenience, it may be simply expressed as a corresponding hexadecimal code. For example, a code for unlocking all vehicle doors of the 1995 Jeep Grand Cherokee is 03868004, and the code is 0422A00400 for the 2000 Jeep Grand Cherokee. Such codes may be obtained directly from the manufacturers, or may be read from the router 11 using one among a plurality of commercially available diagnostic tools.

The command signal set may be repeated as schematically shown in the lower part of the table 20 as described above. Of course, although the memory 184 may actually store the codes, data for generating the command signal set may be stored. This means that a specific part of a code, e.g., the preamble or some other parts, is common to several vehicles and/or several vehicle electronic elements.

Both the number of vehicles and the number of devices to be controlled using the multi-vehicle compatibility of the remote start controller 18 may be relatively large to cover a substantial portion of the vehicle market. In addition, optionally, the concept of multi-command signal may be easily used to provide compatibility for the electronic elements of two vehicles and a single vehicle.

Hereinafter, another communication direction will be described with reference to FIGS. 6 and 7. Particularly, the reverse direction or reading of a signal from the router 11 is described. Since many components are the same as those described above, duplicate descriptions will be omitted. In the illustrated embodiment, the CPU 181 is connected to a code lookup memory 185.

Compatibility of reading a code for a vehicle electronic element in a plurality of vehicles and determining a message or its contents may be used alone or in combination with compatibility for recording or generating a signal by the router described above. More specifically, the remote start controller stores a series of device codes for a given vehicle electronic element for a plurality of different vehicles, reads a device code from the router 11, and determines whether the read device code and the stored device code match in order to provide compatibility with the plurality of different vehicles. This configuration provides a comparatively simple and direct access for interfacing with a vehicle having the router 11.

The remote start controller 18 may include a code lookup memory 185 for the stored device codes, and a processor or a CPU 181 that cooperates with the memory to determine whether the read device code and the stored device code match. The at least one vehicle electronic element may include a plurality of vehicle electronic elements, and accordingly, the memory 185 of the multi-vehicle compatible controller 18 preferably stores a device code set for each of the plurality of vehicle electronic elements.

Hereinafter, the feature of the lookup table of the remote start controller 18 will be described in more detail with reference to FIG. 6. As shown in the figure, a column for vehicle codes may be generated in the common table 30 in a partially predefined sequence, such as a numerical sequence starting with a first code (Code 1) and ending with a last code (Code N). In the illustrated embodiment, the central column includes vehicle identifications corresponding to vehicles extended from a first vehicle (Vehicle A) to a last. vehicle (Vehicle Z). As a plurality of codes and vehicles may be selected, a given remote start controller 18 may be used for many vehicles.

In the table 30 shown in the figure, the last or rightmost column is a vehicle electronic element data or message corresponding to a related vehicle and code. This vehicle electronic element message is extended from the first vehicle electronic element message $DM_{1A}$ to the last vehicle electronic element message $DM_{Nz}$. The message may be many different types, such as open or close of the driver door, open or close of the hood, shock sensor trigger, brake pre-indication display, Park gear shift selection, and the like. In this way, it is possible to refer to engine start by further referring to data related to security.

For example, the common table 30 includes a blocked row schematically showing matching with code 572. This code is for Ford Taurus and indicates that the driver door is open. This type of data may be useful for remote start. The CPU 181 reads the code of the router 11, compares the read code with the stored code, and determines whether the codes match. Since some or all of the codes could be buffered when the codes are received thereafter, the CPU 181 compares the codes using the table 30. In another embodiment, individual bits or a block thereof may be compared when they are received.

An optional embodiment of the common table 30 is described hereinafter with reference to FIG. 7. In this case, the entire or part of the common table 30' may be regarded as being parsed or partitioned into a plurality of vehicle table sections. In the illustrated embodiment, a first table section is for vehicle A, and the last section is for vehicle Z. This embodiment also shows the driver door for Ford Taurus, which is matched from the read signal from the router 11.

What is important in this embodiment is that this is only for a code for initial setting or initial learning period. A trained vehicle needs to be compared with the read code thereafter. Accordingly, time saving can be realized.

Figure 6:
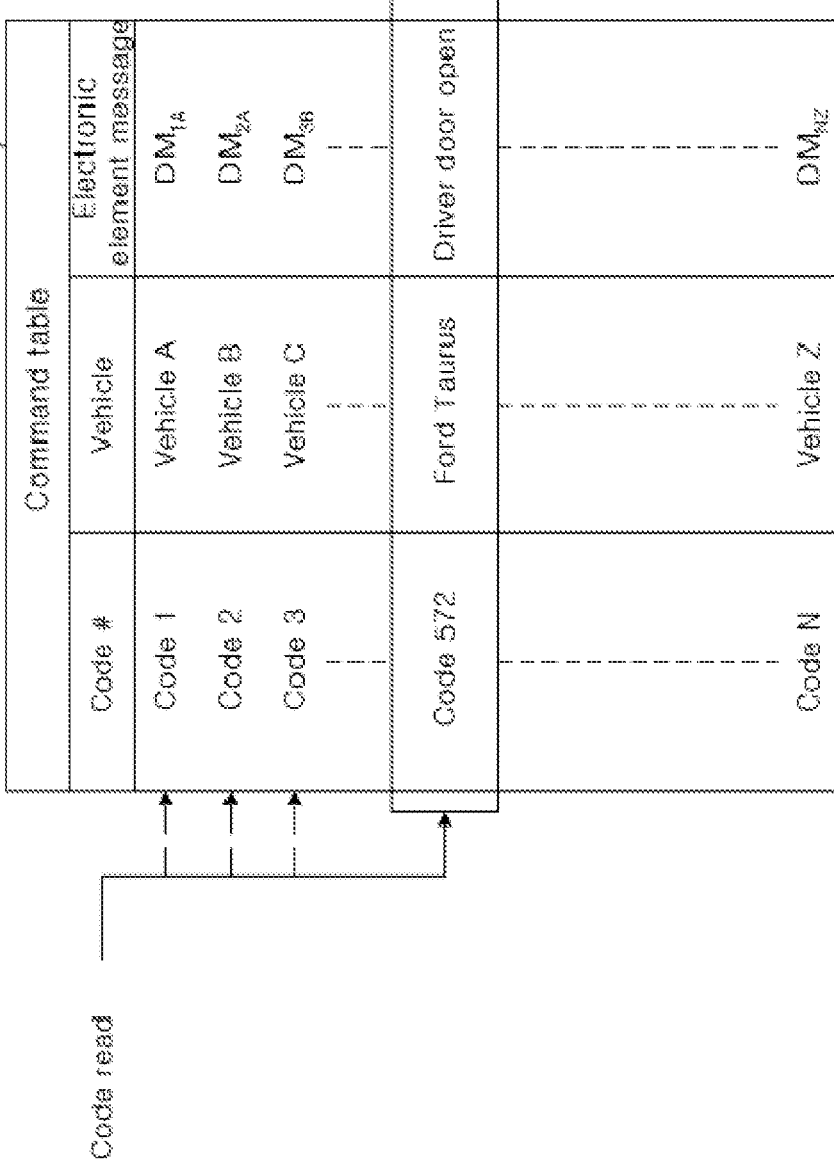
FIG. 6 is a view showing an example of processing, by the remote start module of FIG. 4, a code read from the router.
Figure 7:
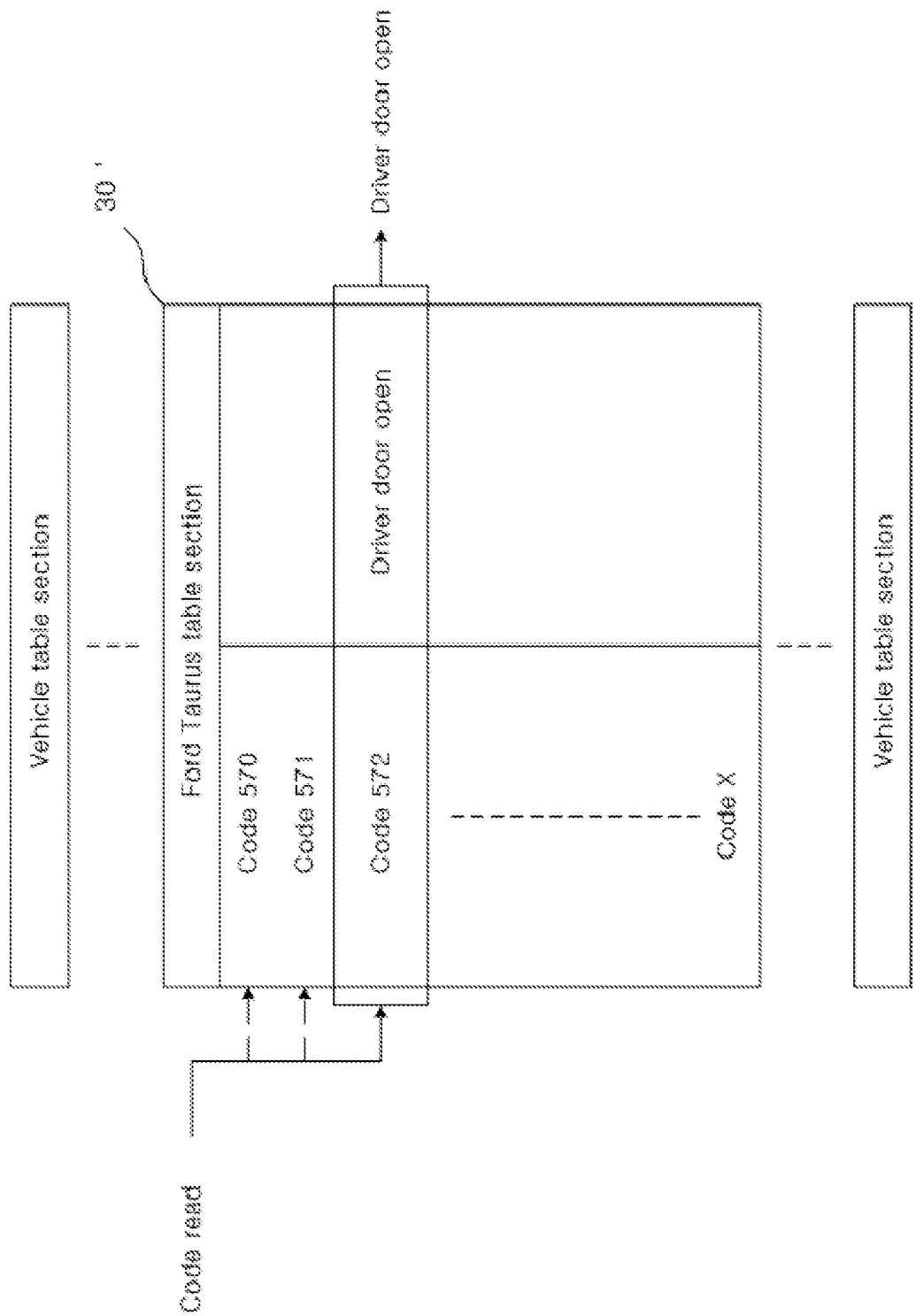
FIG. 7 is a view showing another example of processing, by the remote start module of FIG. 4, a code read from the router.
Figure 8:
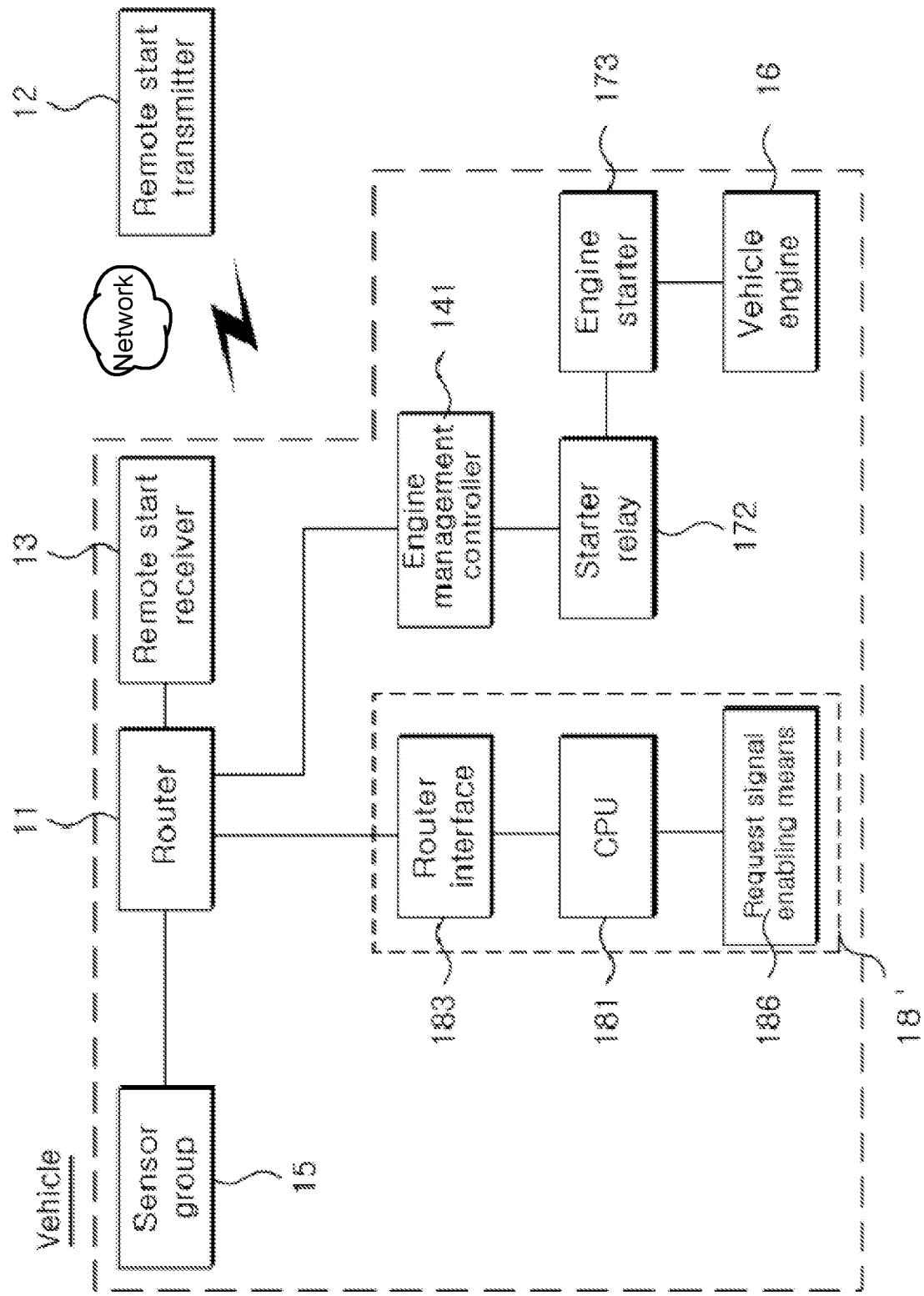
FIG. 8 is a block diagram showing a control circuit of an Ethernet-based vehicle control system including a remote start module as a second application example of the present invention.

Here, the tables 30 and 30' of FIGS. 6 and 7 are shown as an example from the configuration of a plurality of possible lookup tables that may be used according to the present invention. Other configurations are also considered by the present invention.

Since it may also be desirable to re-install the remote start controller 18 in another vehicle, the remote start controller 18 may be reset, and another vehicle may be trained or configured during the initial setup.

The request signal enabling is further described below with reference to FIGS. 8 to 13. Multi-vehicle compatibility may be provided by including a request signal enabling means 186 in the remote start controller 18'. This function or feature is intended to enable operation by using a request signal set for a corresponding requesting vehicle from a plurality of signal sets. It provides compatibility of different vehicles with a plurality of different vehicles.

The remote start controller 18' does not necessarily represent or include the hardwired interface 182 described above. Rather, in this embodiment, the remote start function is implemented by the remote start controller 18' through communication with the engine management controller 141, and the engine management controller 141 is directly connected to the start relay 172.

Figure 9:
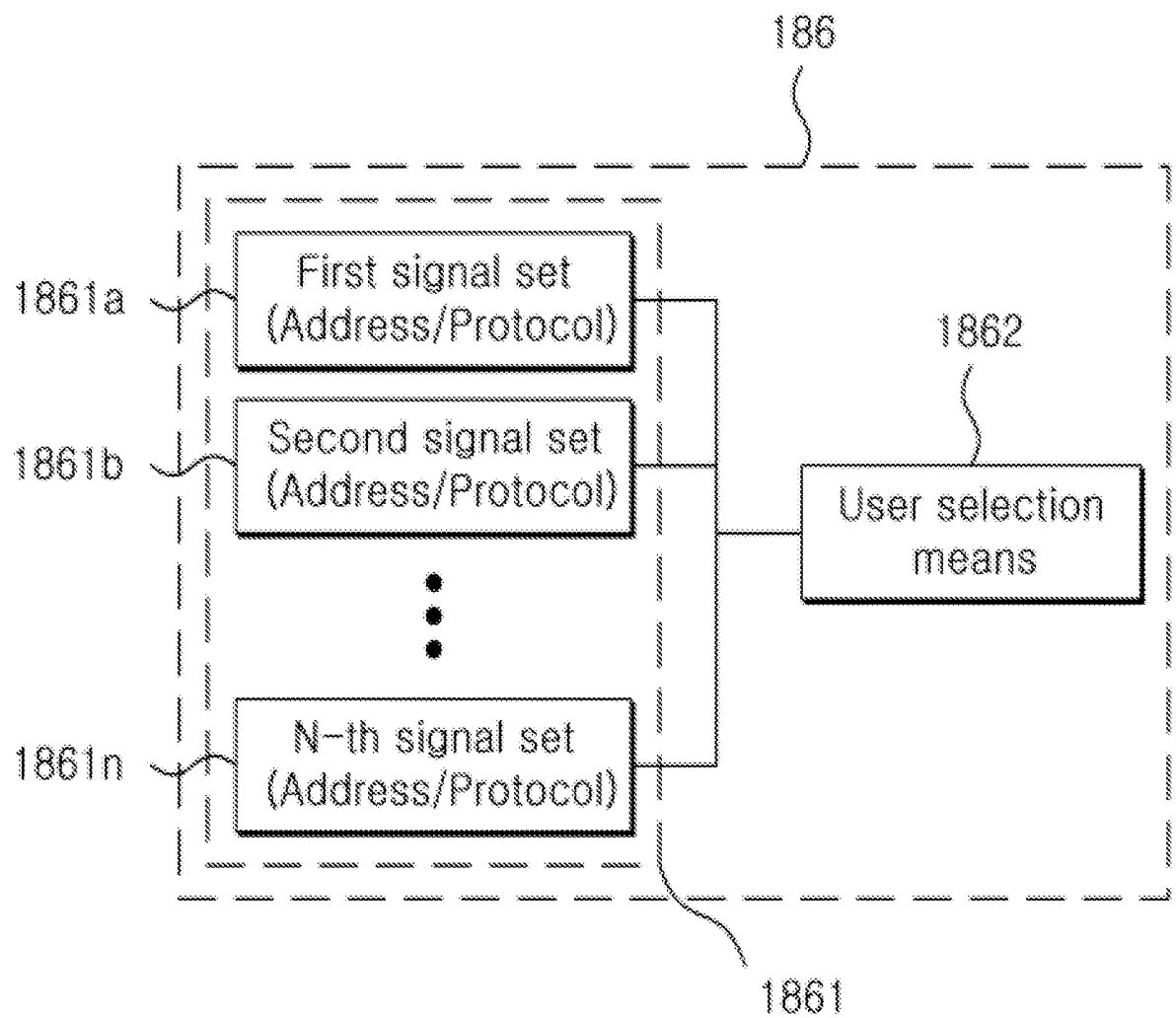
FIG. 9 is a view showing an example of a request signal enabling part of the remote start module of FIG. 8.

Referring to FIG. 9 now, a first embodiment of the request signal enabling means 186 is described in FIG. 9. The request signal enabling means 186 is for the remote start controller 18' to operate using a request signal set for a requesting vehicle among a plurality of possible signal sets for different vehicles. Here, the term different vehicles may include vehicles of different manufacturers, different models, or even different trim levels of the same manufacturer and model. Accordingly, the request signal enabling means 186 allows the remote start controller 18', i.e., the CPU 181 and the router interface 183, to communication with the sensor group 15, the engine management controller 141, or other vehicle electronic elements through the router 11. The CPU 181 may start the vehicle engine 16 in response to the remote start receiver 13 receiving a remote start signal from the remote start transmitter 12.

As shown in FIG. 9, an embodiment of the request signal enabling means 186 may preferably include a memory 1861 for storing a plurality of signal sets 1861*a*, 1861*b* and 1861*n* for different vehicles, and a selection means for selecting a request signal set from the plurality of different signal sets. Storing a signal set means storing information or data needed for generating a request signal by the router 11. The memory 1861 may include a vehicle electronic element address memory means for storing signals of a plurality of different sets indicating different vehicle electronic element addresses (MAC addresses) for different vehicles. Optionally or additionally, the memory means may include a protocol memory means for storing a plurality of different protocols for different vehicles.

As shown in FIG. 9, the selection means may include a user selection means 1862 that allows a user to select a request signal set. A keypad or other input means may be used to allow the user to select a request signal set for his or her vehicle.

For example, a valet switch or other control switches such as the remote start controller 18 may also be handled by the user to select a request signal set. The user may select a request signal set by entering a unique digital code similar to signal selection for universal remote control of home appliances. Other techniques that allow the user to select a request signal set from a plurality of stored sets are also considered by the present invention.

Figure 10:
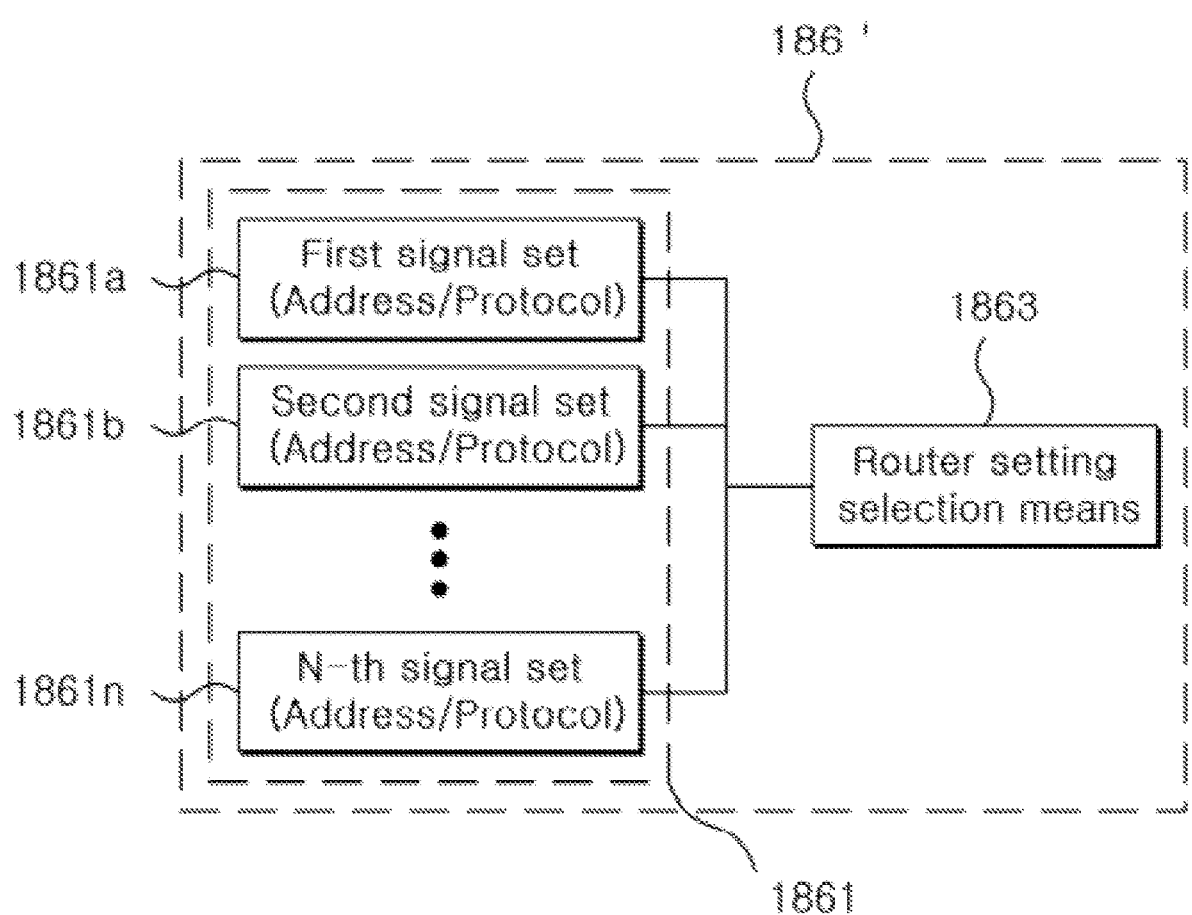
FIG. 10 is a view showing another example of a request signal enabling part of the remote start module of FIG. 8.

Further referring to FIG. 10 now, in FIG. 10, another embodiment of the request signal enabling means 186' is described according to the remote start controller 18' of the present invention. In this embodiment, the selection means may include a router setting selection means 1863 for determining a request signal set based on a signal. For example, the router setting selection means 1863 may determine a request signal set based on a sensed voltage level or timing of the signal pulse of the router. Since other components of the request signal enabling means 186 of this embodiment are similar to those described in FIG. 9, further description thereof will be omitted.

Figure 11:
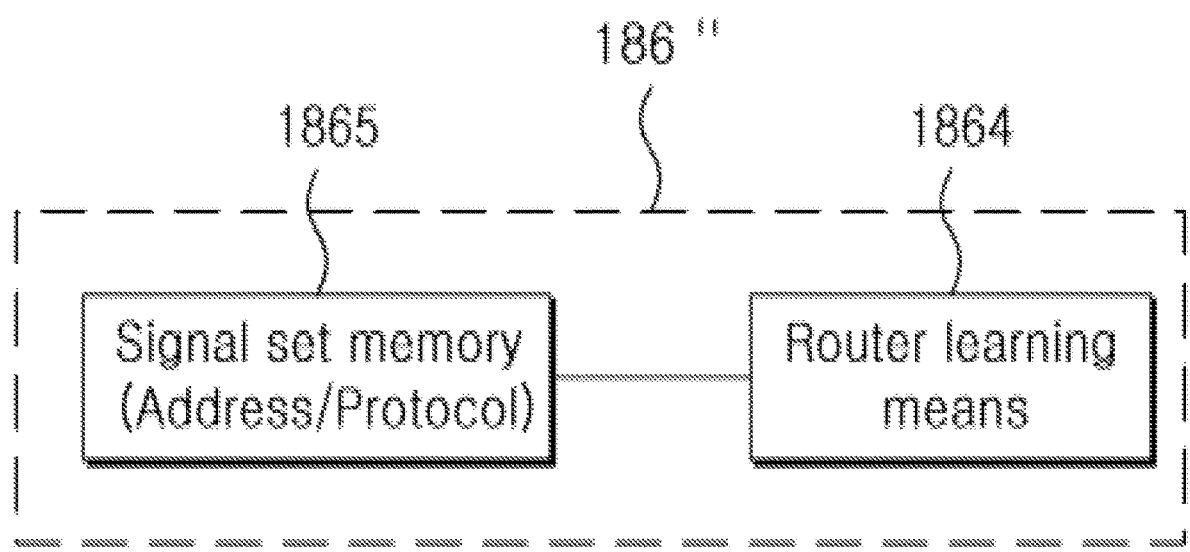
FIG. 11 is a view showing still another example of a request signal enabling part of the remote start module of FIG. 8.

Still another embodiment of the request signal enabling means 186" according to the present invention will be described with reference to FIG. 11. In this illustrated embodiment, the request signal enabling means 186" includes a signal set memory 1865 operatively connected to the router learning means 1864 shown in the figure. The router learning means 1864 may determine and store a protocol and/or a MAC address for a vehicle electronic element in the signal set memory 1865. For example, the router learning means 1864 may allow a user to handle various vehicle electronic elements and store a request signal set. Since other components of the request signal enabling means 186" are similar to those described in FIG. 9, further description thereof will be omitted.

Figure 12:
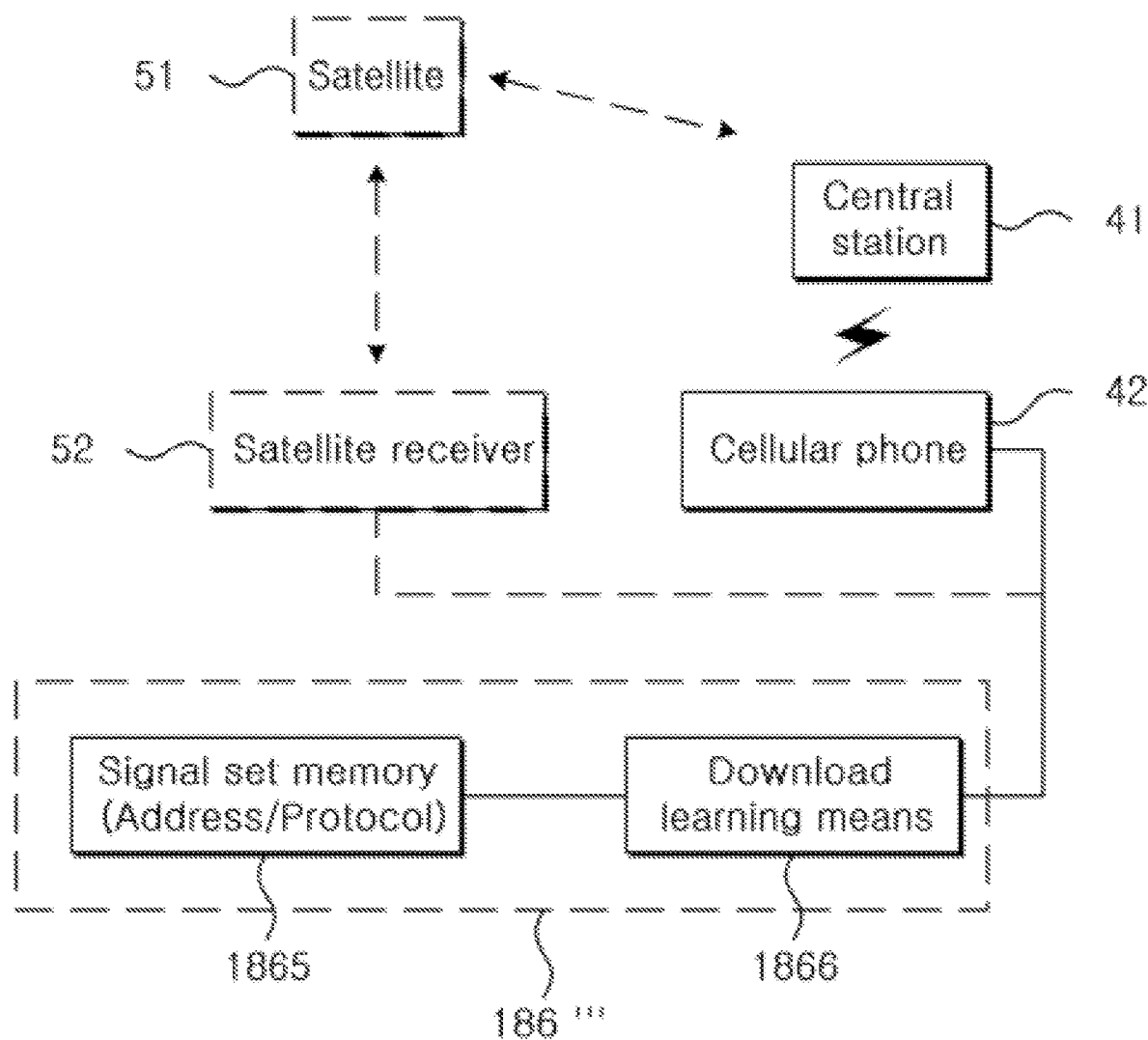
FIG. 12 is a view showing still another example of a request signal enabling part of the remote start module of FIG. 8.

Still another embodiment of the request signal enabling means 186''' will be described with reference to FIG. 12. The request signal enabling means 186 includes a signal set memory 1865 operably connected to a download learning means 1866 schematically shown in the figure. For example, it includes an interface connected to the illustrated vehicle cellular phone 42 to allow learning or download of a request signal set from a remote or central monitoring and control station 41. The request signal set may also be alternately trained from the remote or central monitoring and control station 41 through a satellite link provided by a satellite 51, a vehicle-mounted satellite receiver 52, and related antennas. The download learning means 1866 and other request signal enabling means may be implemented by software in the CPU of the remote start controller 186''' or a separate microprocessor or circuit.

Figure 13:
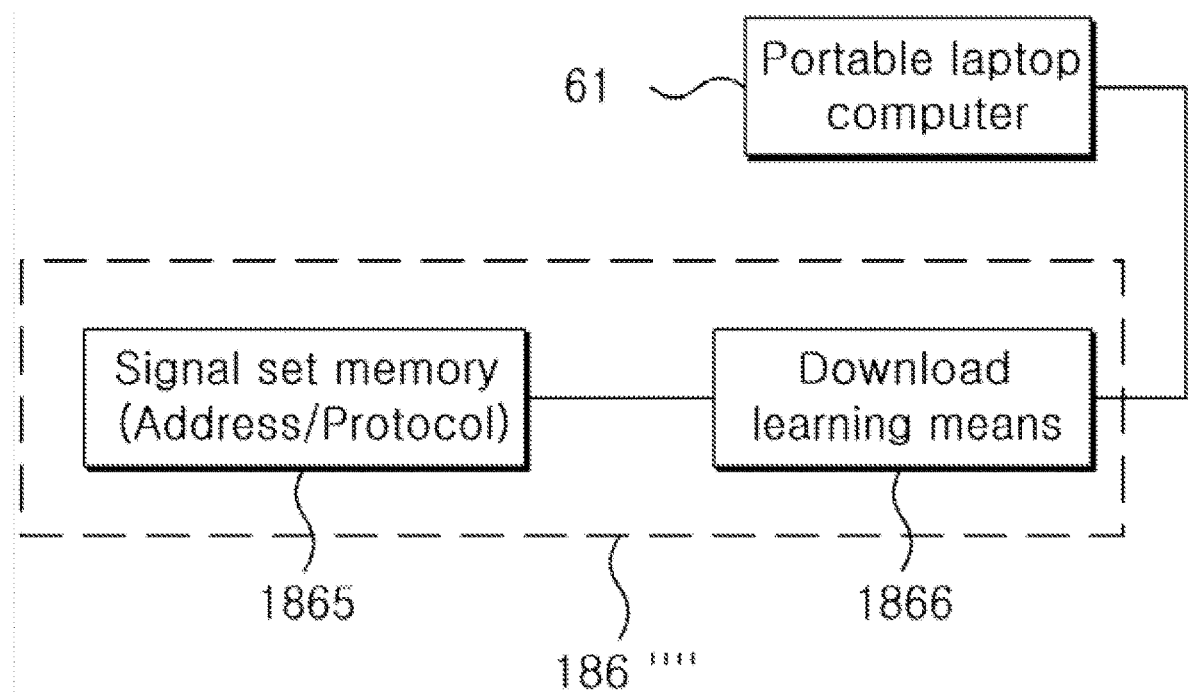
FIG. 13 is a view showing still another example of a request signal enabling part of the remote start module of FIG. 8.

Further referring to FIG. 13 now, still another variation of programming, learning or downloading of the download learning means 1866 is described. In this variation, the download learning means 1866 is temporarily connected to a computer such as the portable laptop computer 61 shown in the figure. The connection may be made through a wired or wireless communication link. Of course, in this embodiment, the request signal enabling means 186"" may be programmed in the vehicle or before being installed in the vehicle.

Returning to and referring to FIG. 4 again, the concept of a command signal for driving the router 11 using a plurality of signal codes to provide multi-vehicle compatibility is reviewed again. In another embodiment, the remote start controller 18 may be divided into two sections or parts. More specifically, multi-vehicle compatibility may be provided by a multi-vehicle compatible adapter including a CPU 181, a command signal memory 184, and optionally a router interface 183. The adapter may also include its own housing. One scenario in which the adapter approach like this may be particularly useful is to adapt an existing remote start controller 18 to operate through the router 11. Since the router 11 technique progresses slowly in steps, suppliers may add the adapter like this to an existing controller when automobile manufacturers provide a conventional vehicle control system for existing vehicles and a vehicle requests an interface to the router 11. Alternatively, the remote start controller 18 may be provided by a conventional remote start controller, or the remote start may be, for example, a supportive output of a vehicle security controller.

A similar concept may be extended to another communication direction, i.e., a multi-vehicle compatible adapter from the router 11 to one or more vehicle electronic elements. Such an adapter will include the code lookup memory 185 described above. In addition, since operation of the multi-vehicle compatible adapter may be based on the description provided above in relation to FIGS. 4 to 6, no further discussion is required. Of course, these adapters may be used independently, may be used together, or may be combined into a single unit.

The embodiment of the method of the present invention is to remotely start the vehicle engine 16 of a vehicle including the router 11 and at least one or more vehicle electronic elements 141 to 143 and 151 to 154 related to start of the vehicle engine 16. This method preferably includes the steps of receiving a signal, by a vehicle, from the remote start transmitter 12, connecting the remote start controller 18 to the router 11 to communicate with at least one vehicle electronic element, and starting the vehicle using the remote start controller 18 to start the vehicle engine 16 based on the signal received from the remote start transmitter 12 and communication with at least one vehicle electronic element through the router 11.

Here, additionally, a case in which remote start is performed using the engine speed signal among the drive system state information described above will be described.

Figure 14:
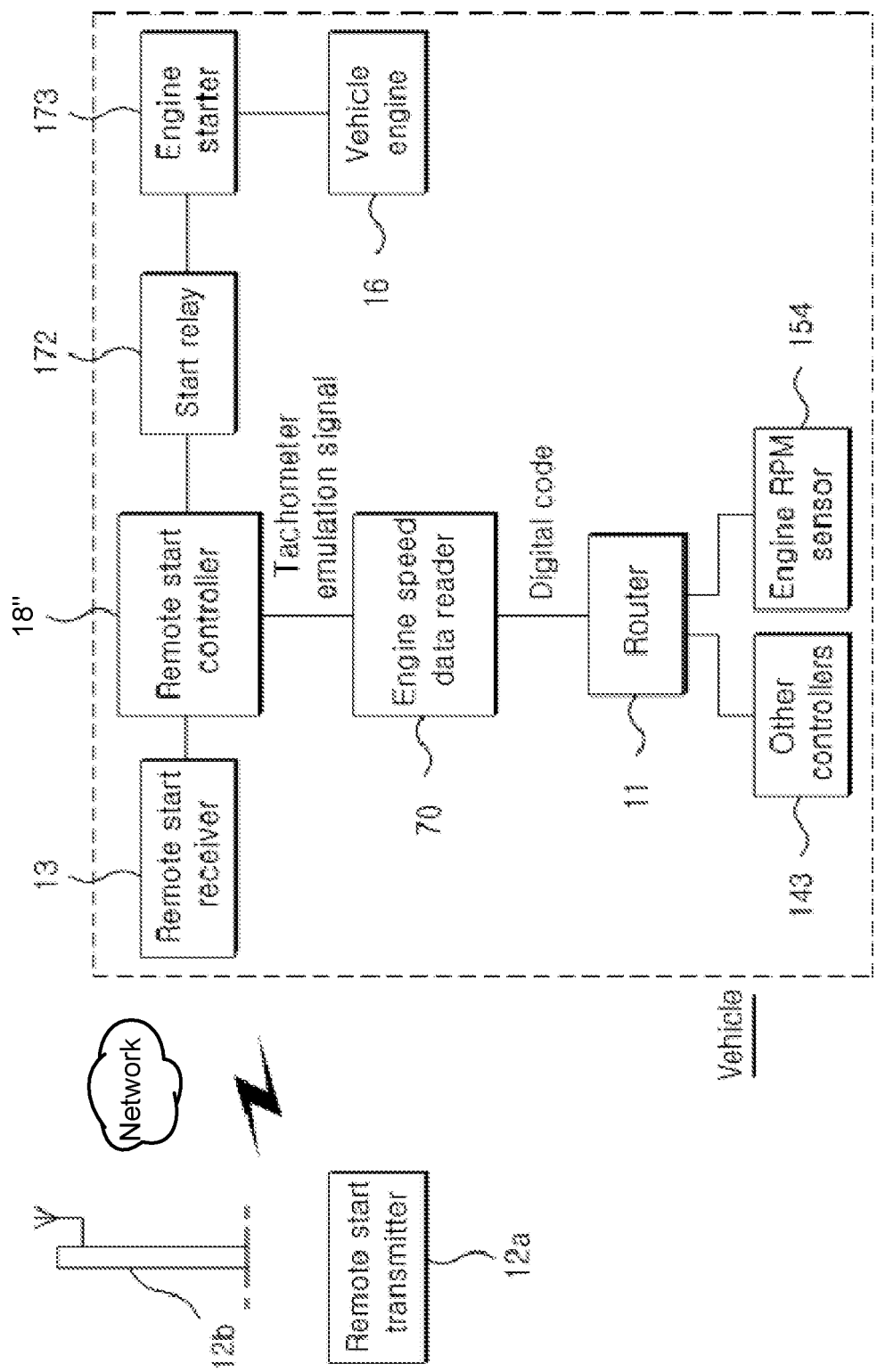
FIG. 14 is a block diagram showing a control circuit of an Ethernet-based vehicle control system further including an engine speed data reader as a third application example of the present invention.

Now, an Ethernet-based vehicle control system further comprising an engine speed data reader is described by adding FIGS. 14 to 17. Particularly, as shown in FIG. 14, the Ethernet-based vehicle control system may include an engine speed data reader 70 in the vehicle to read an engine speed signal from the router 11, and the remote start controller 18" is connected to the remote start receiver 13 and the engine speed data reader 70 to operate the engine starter 173 based on the remote start transmitter 12a and 12b and the engine speed signal. The remote start transmitter 12 may be a remote handheld transmitter 12a that can be carried by a user when the user is away from the vehicle. Optionally or additionally, the remote starting transmitter 12 may include a remote or fixed central station transmitter 12b. Here, the engine speed signal may include a digital code generated by another controller 143 and/or an engine RPM sensor 154 connected to the router 11.

In the illustrated embodiment, the engine speed data reader 70 reads and converts a digital code into a pulse-type tachometer emulation signal for the remote start controller 18". Therefore, the Ethernet-based vehicle control system may easily interface with a vehicle having a router 11 to operate using the engine speed signal. Furthermore, the remote start controller 18" may be a conventional remote start controller that is typically used in the aftermarket and uses the engine speed signal for proper operation.

For example, the remote start controller 18" may use the start relay 172 to separate the engine starter 173 from the engine 16, and the engine reaches an engine start threshold value within a range corresponding to engine revolution of 50 to 1,000 per minute based on the tachometer emulation signal. Similarly, the remote start controller 18" may stop the engine 16 based on a tachometer emulation signal that reaches an engine overspeed threshold value corresponding to engine revolution of 2,500 or more per minute. Of course, other threshold values may be used, and these threshold values may be set in the remote start controller 18". In some embodiments, one, two or all of the thresholds may be used by the remote start controller 18".

Figure 15:
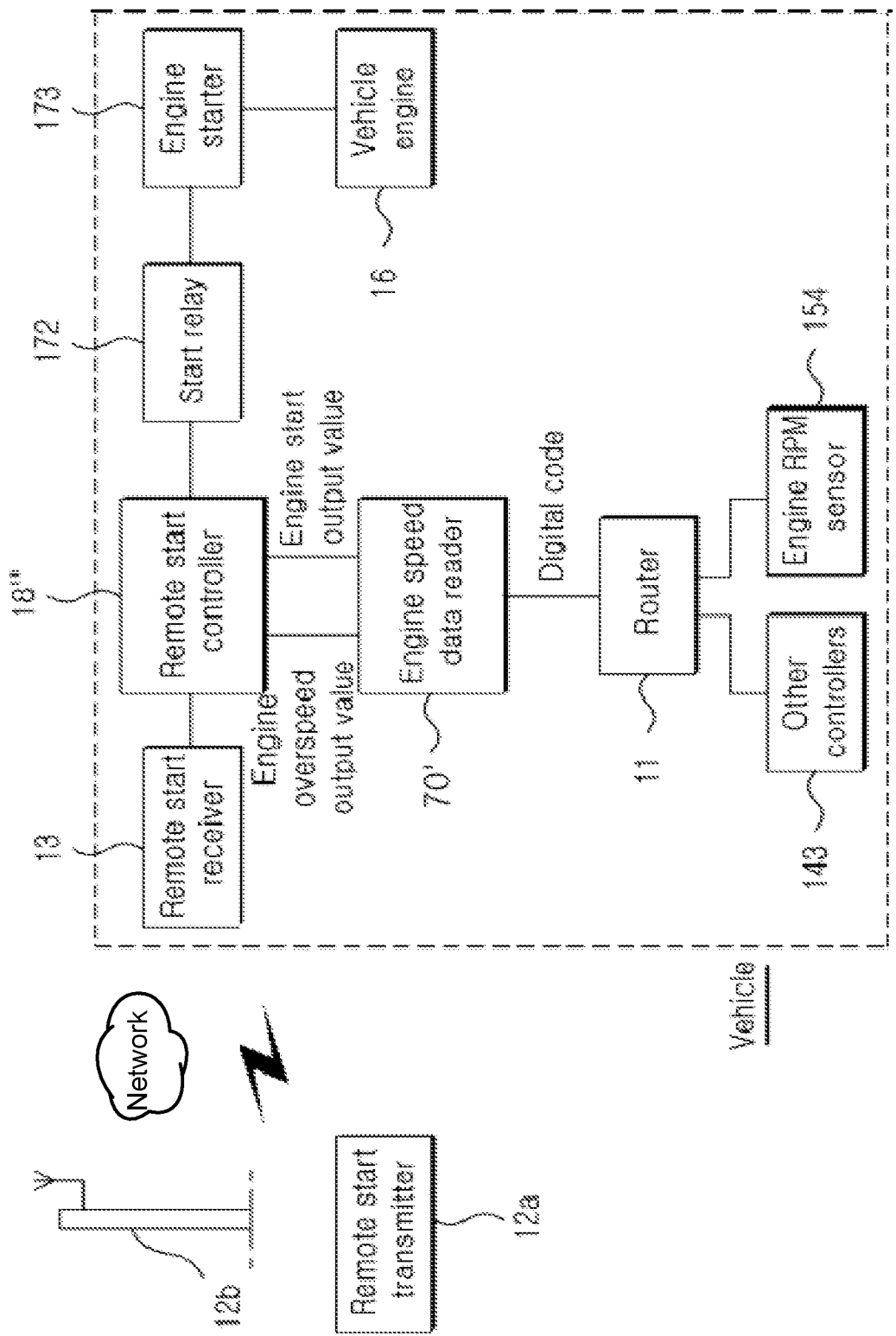
FIG. 15 is a block diagram showing a control circuit of an Ethernet-based vehicle control system further including an engine speed data reader as a fourth application example of the present invention.

Now, another embodiment of the Ethernet-based vehicle control system will be described with reference to FIG. 15. In this embodiment, although the engine speed signal also includes a digital code, the engine speed data reader 70' converts the digital code into at least one output value for the remote start controller 18'''. For example, the at least one output value may include an engine start output value based on a digital code reaching an engine start threshold value within a range corresponding to engine revolution of 50 to 1,000 per minute. The remote start controller 70' may operate the engine starter 173 in response to the engine start output value. The output value may be, for example, vehicle ground, a positive vehicle voltage, or a value therebetween.

Similarly, the at least one output value may include an engine overspeed output value based on a digital code reaching an engine overspeed threshold corresponding to engine revolution of 2,500 or more per minute. The remote start controller 18''' may stop the engine 16 in response to the engine overspeed output value. In other words, in this kind of embodiment, the engine speed data reader 70' compares the engine speed with one or two threshold values and provides a corresponding output based on the comparison.

Figure 16:
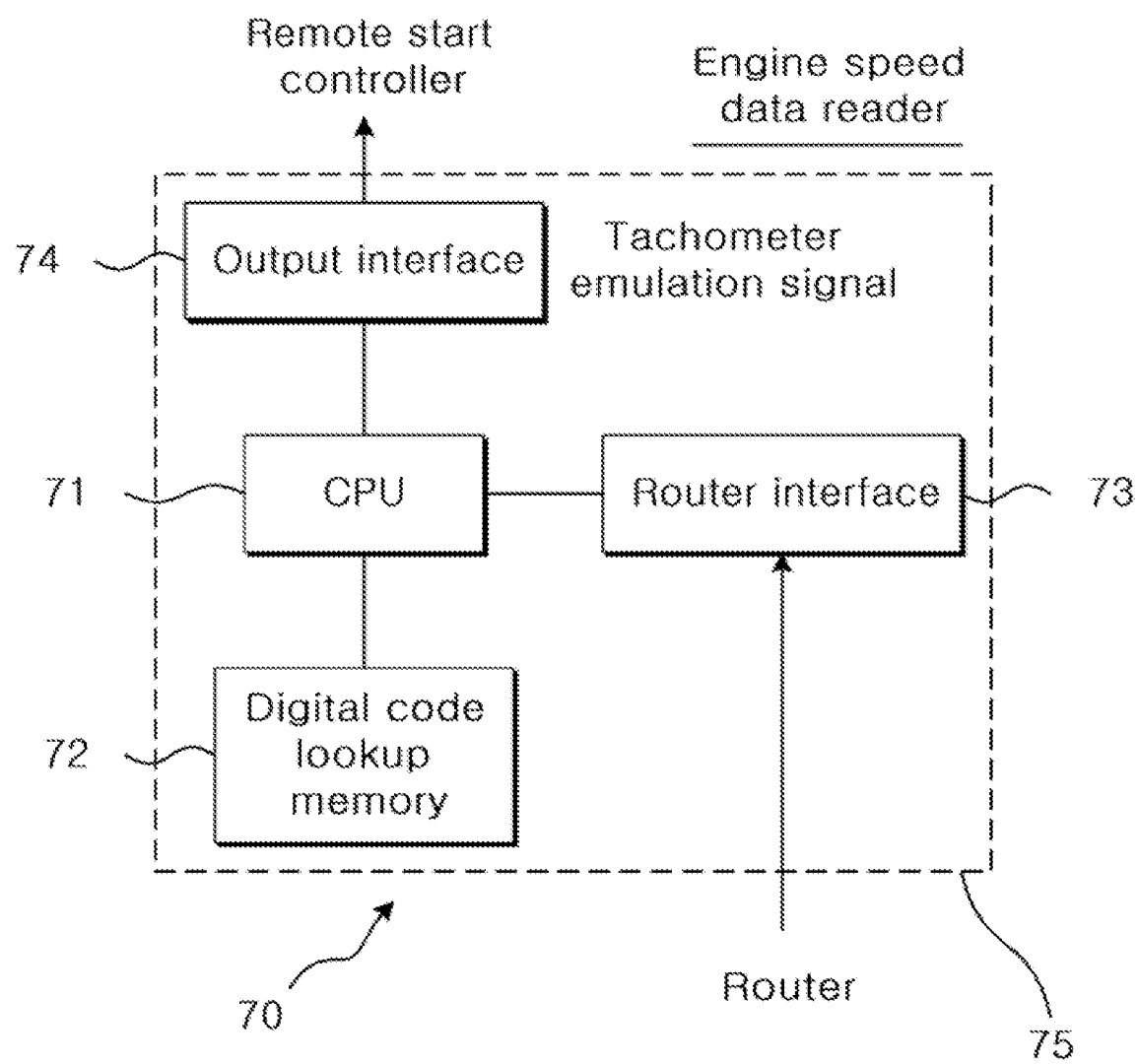
FIG. 16 is a block diagram showing a control circuit of the engine speed data reader of FIG. 14.

As shown in the illustrated embodiment of FIG. 16, the engine speed data reader 70 may include a central processing unit (CPU) or a processor 71 for performing various functions under the control of a stored program. Particularly, the CPU 71 is exemplarily connected to a router interface 73 or a receiver to receive a signal including an engine speed signal from the router 11. For example, the router interface 73 may demodulate or decode the signal of the router 11 to extract a digital code corresponding to the engine speed. The CPU 71 may process the demodulated signal or the extracted digital code to generate a pulse-emulated tachometer signal in cooperation with an output interface 74. The pulse-emulated tachometer signal is maintained, for example, at the rate of pulse of the last digital code until a new digital code is read.

The emulated tachometer signal may be used by the remote start controller 18" even in the case of, for example, a conventional aftermarket controller without having other router functions. Of course, the engine speed data reader 70 having a pulse-emulated tachometer signal may also be used together with a more sophisticated remote start controller 18" having some router functions. The pulse-emulated tachometer signal may correspond to, for example, a pulse signal generated by a tachometer sensor coupled to a conventional ignition system.

According to another characteristic of the present invention, the engine speed data reader 70 may switch between a sleep mode and an operation mode based on an activity in the router 11. Determination on the activity may be made by the CPU that drives the power consumption output interface 74 only when there are sufficient activities in the router 11. Accordingly, when there is little or no activities in the router, power consumption may be reduced.

According to another characteristic of the present invention, the engine speed data reader 70 may include a multi-vehicle compatible engine speed data reader. More specifically, the multi-vehicle compatible engine speed data reader 70 may store a digital code set for each of a plurality of different vehicles in a digital code lookup memory 72, read a digital code from the router 11, and determine whether or not the read digital code matches a stored digital code to provide compatibility with a plurality of different vehicles. In other words, since the multi-vehicle compatible engine speed data reader 70 includes a plurality of signal compatible means of different vehicles, which allows to operate using a desired digital code set for a corresponding desired vehicle among a plurality of digital code sets for different vehicles, it may provide compatibility with a plurality of vehicles. Since various embodiments of the request signal enabling means have been extensively discussed above, further description thereof will be omitted.

As shown in the embodiment of FIGS. 14 and 16, the engine speed data reader 70 may include a first housing 75 and a first circuit 71 to 74 carried by the housing, and the remote start controller may include a second housing and a second circuit carried by the housing. In other embodiments, the first and second circuits may be included in, for example, a common housing.

Figure 17:
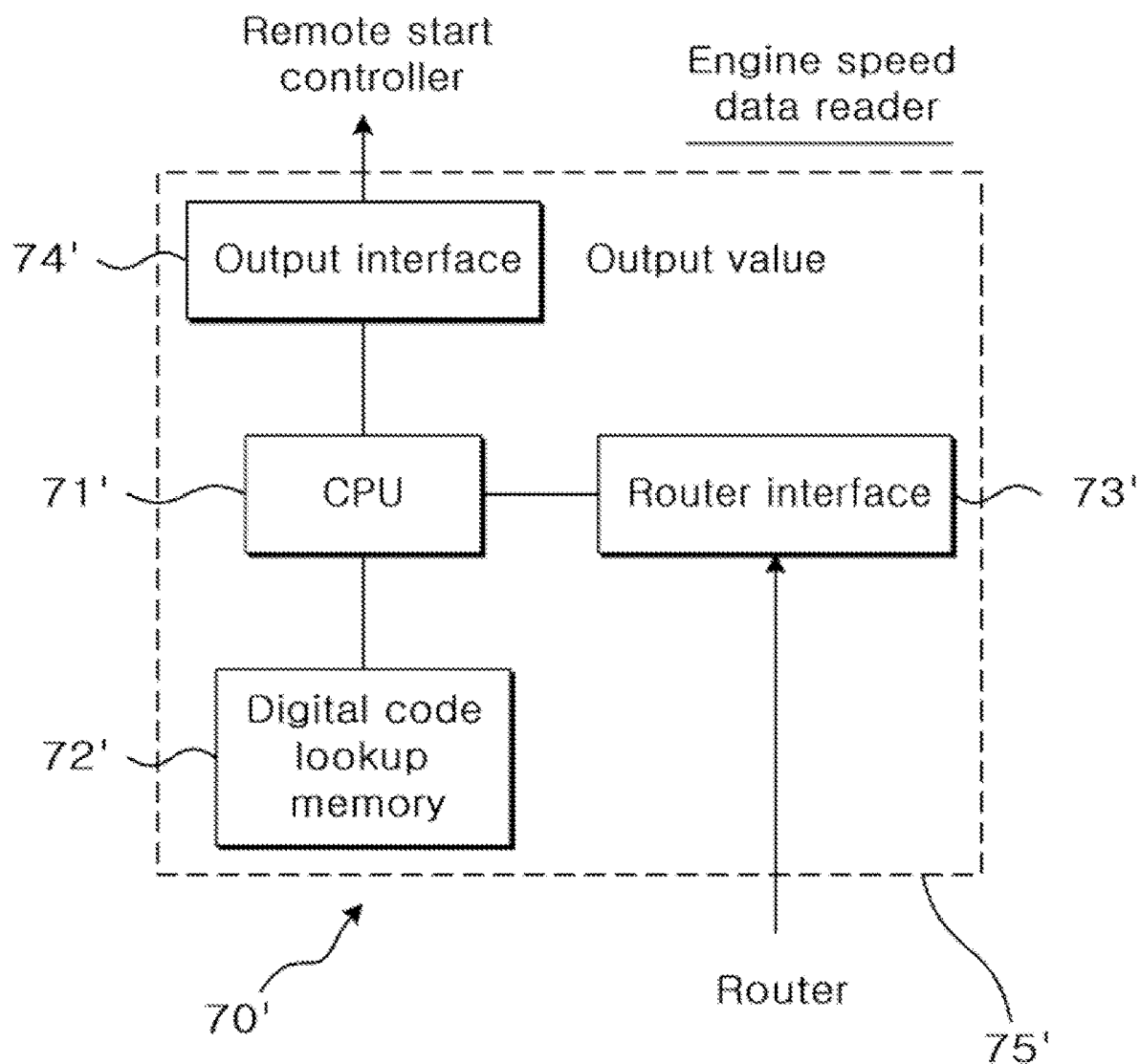
FIG. 17 is a block diagram showing a control circuit of the engine speed data reader of FIG. 15.

Now, a second embodiment of the engine speed data reader 70' will be described with reference to FIG. 15 again by adding FIG. 17. In this embodiment, the CPU 71' may compare a digital code read from the router by the router interface 73' with one or more speed threshold values, and allow the output interface 74' to generate a desired output value based on the comparison. In other words, the CPU 71' and the output interface 74' may cooperate to convert the digital code into at least one output value for the remote start controller 18'''. For example, the at least one output value may include an engine start output value based on a digital code reaching an engine start threshold value within a range corresponding to engine revolution of 50 to 1,000 per minute. The remote start controller 18''' may operate the engine starter 173 in response to the engine start output value.

Similarly, the at least one output value may include an engine overspeed output value based on a digital code reaching an engine overspeed threshold value corresponding to engine revolution of 2,500 or more per minute. The remote start controller 18''' may stop the engine 16 in response to the engine overspeed output value.

The output value may be, for example, vehicle ground, a positive vehicle voltage, or a value therebetween. A current, a voltage and/or a pulse signal may be used as the output value in the same manner as being used by a general aftermarket remote start controller. The output value may be output, for example, in a serial manner or a parallel manner.

An embodiment of a corresponding method of the present invention is to remotely start a vehicle including an engine 16, an engine starter 173, and a router 11 that transfers an engine speed signal. This method may include the steps of connecting an engine speed data bus reader 70 or 70' for reading an engine speed signal on a vehicle data communication bus 30, and operating the engine starter 173 based on the engine speed signal read by the engine speed data reader 70 or 70' on the basis of the remote start transmitter 12a and 12b.

Other features related to the immobilizer circuit are also applicable to these embodiments including the engine speed data reader 70 or 70'. A circuit that actually operates as the immobilizer may be integrated with engine speed data reader 70 or 70'.

As described above, according to the Ethernet-based vehicle control system and method of the present invention, as it is possible to freely mount and replace a third-party module on the basis of Ethernet through verification, clone or the like of a Media Access Control (MAC) address, various services related to a vehicle can be realized through a vehicle external network.

In addition, according to the Ethernet-based vehicle control system and method of the present invention, when whether or not to perform remote start is controlled in response to an engine RPM during the remote start, efficient management of engine protection and fuel consumption can be achieved, and in addition, when whether or not to perform remote start is controlled in response to the position of the transmission, safe remote start can be achieved.

The technical spirit of the present invention has been described above through several embodiments.

It is apparent that those skilled in the art may diversly modify or change the embodiments described above from the description of the present invention. In addition, although it is not explicitly shown or described, it is apparent that those skilled in the art may make modifications of various forms including the technical spirit of the present invention from the description of the present invention, and this still belongs to the scope of the present invention. The embodiments described above with reference to the accompanying drawings are described for the purpose of describing the present invention, and the scope of the present invention is not limited to these embodiments.

What is claimed is:

1. An Ethernet-based vehicle control system, comprising:
   a router configured to enable communication between a vehicle internal network and a vehicle external network when the vehicle internal network is formed by connecting an engine and a vehicle electronic element including a controller and a first sensor; and
   a remote start module as a third-party module configured to remote start the engine, wherein:
   the remote start module comprises:
      a remote start receiver for receiving a remote start signal transmitted from a remote controller through the vehicle external network; and
      a remote start controller for controlling engine start by an engine speed signal received from at least one vehicle electronic element that senses an engine speed among a drive system state information, the remote start signal, and a virtual signal randomly generated in connection with remote start;
   the remote start module is configured to be installed on the vehicle as the third-party module to control the vehicle electronic element, wherein:
      the vehicle electronic element is configured to communicate with the router via the third-party module; and
      the third-party module is controlled by the remote controller through the vehicle external network, wherein the remote controller is configured to send and receive input and output signals respectively to the vehicle electronic element via the third- party module, wherein the third-party module is configured to:
         clone a Media Access Control (MAC) Address of the vehicle electronic element in response to the input and output signals to perform at least one of:
            matching and converting the input and output signals to directly control the vehicle electronic element;
            bypassing the input and output signals; and
            overriding the input and output signals; and
         based on the remote start signal transmitted from the remote controller through the vehicle external network, wherein whether or not to perform the remote start is determined based on the drive system state information generated by the vehicle electronic element and transferred via the router.

2. The system according to claim 1, further comprising an engine speed data reader installed between the remote start controller and the router to detect the engine speed and generate the engine speed signal.

3. The system according to claim 2, wherein the engine speed data reader is configured to read a digital code of the engine speed signal and convert the digital code into a pulse-type tachometer emulation signal, and the remote start controller operates the remote start signal and the pulse-type tachometer emulation signal.

4. The system according to claim 3, wherein the remote start controller starts the engine based on the pulse-type tachometer emulation signal reaching an engine start threshold value within a range corresponding to engine revolution of 50 to 1,000 per 51 minute, and stops the engine based on the pulse-type tachometer emulation signal reaching an engine overspeed threshold value corresponding to engine revolution of 2,500 or more per minute.

5. The system according to claim 2, wherein the engine speed data reader is configured to read a digital code of the engine speed signal and converts convert the digital code into at least one output value based on the digital code reaching at least one threshold value, and the remote start controller operates the engine based on the remote start signal and the at least one output value.

6. The system according to claim 5, wherein the remote start controller starts the engine based on a pulse-type tachometer emulation signal reaching an engine start threshold value within a range corresponding to engine revolution of 50 to 1,000 per minute, and stops the engine based on the pulse-type tachometer emulation signal reaching an engine overspeed threshold value corresponding to engine revolution of 2,500 or more per minute.

7. An Ethernet-based vehicle control system, comprising:
   a router configured to enable communication between a vehicle internal network and a vehicle external network wherein, the vehicle internal network is formed by connecting an engine and a vehicle electronic element including a controller and a first sensor; and
   a remote start module as a third-party module configured to remote start the engine, wherein:
   the remote start module comprises:
   a remote start receiver for receiving a remote start signal transmitted from a remote controller through the vehicle external network; and
   a remote start controller for controlling engine start by a transmission position data received from at least one vehicle electronic element related to a transmission position among a drive system state information, the remote start signal, and a virtual signal randomly generated in connection with remote start;
   the remote start module is configured to be installed on the vehicle as the third-party module to control the vehicle electronic element, wherein:
   the remote start controller allows engine start only when a transmission is in a preset position, and the preset position is a Park position;
   the vehicle electronic element is configured to communicate with the router via the third-party module; and
   the third-party module is controlled by the remote controller through the vehicle external network, wherein the remote controller is configured to send and receive input and output signals respectively to the vehicle electronic element via the third-party module, wherein the third-party module is configured to:
clone a Media Access Control (MAC) Address of the vehicle electronic element in response to the input and output signals to perform at least one of:
matching and converting the input and output signals to directly control the vehicle electronic element;
bypassing the input and output signals; and
overriding the input and output signals; and
based on the remote start signal transmitted from the remote controller through the vehicle external network, wherein whether or not to perform the remote start is determined based on the drive system state information generated by the vehicle electronic element and transferred via the router.

8. The system according to claim 7, wherein the router further includes at least one sensor related to security, wherein the remote start module controls remote start by combining security data generated by the at least one sensor related to security.

9. The system according to claim 7, wherein the remote controller includes a remote handheld transmitter carried by a user when the user is away from the vehicle.

10. The system according to claim 7, wherein the remote start module performs any one among:
a process of converting a packet transmitted from the vehicle external network into a signal required by the vehicle electronic element in response to the packet and transmitting the signal to the vehicle electronic element so that the vehicle electronic element performs a corresponding operation;
a process of directly controlling a corresponding vehicle electronic element in response to the packet transmitted from the vehicle external network;
a process of bypassing input and output packets to the vehicle electronic element or the vehicle external network as they are; or
a process of ignoring a packet output from the vehicle electronic element and modulating and transmitting a corresponding packet to the vehicle electronic element and the vehicle external network, or deleting a packet input into the vehicle electronic element and modulating and transmitting a corresponding packet to the vehicle electronic element.

11. An Ethernet-based vehicle control method applied to an Ethernet-based vehicle control system comprising a router configured to enable communication between a vehicle internal network and a vehicle external network via a third-party module wherein, the third party-module is configured to be installed on a vehicle to control the vehicle internal network, wherein the vehicle internal network is formed by connecting an engine and a vehicle electronic element including a controller and a first sensor, the method comprising the steps of:
initializing a remote start using a remote start module that is configured to remote start the engine as the third-party module, wherein the remote start module comprises:
a remote start receiver, wherein the remote start receiver is configured to receive a remote start signal transmitted from a remote controller through the vehicle external network; and
a remote start controller configured to control the engine start on receiving an engine speed signal from the vehicle electronic element that senses an engine speed among a drive system state information, the remote start signal, and a virtual signal randomly generated in connection with remote start;
transmitting the drive system state information generated by the vehicle electronic element to the router via the third-party module in response to a drive system state detected by the sensor in the vehicle electronic element;
reading the drive system state information from a reader connected to the router; and
performing remote start by the remote start module in response to the remote start signal transmitted from the remote controller through the vehicle external network, wherein whether or not to perform the remote start is determined based on the drive system state information generated by the vehicle electronic element and transferred via the router, wherein performing the remote start by
the remote start module comprises the steps of:
controlling the third-party module by the remote controller through the vehicle external network, wherein the remote controller is configured to send and receive input and output signals respectively to the vehicle electronic element via the third-party module, wherein the third-party module is configured to clone a Media Access Control (MAC) Address of the vehicle electronic element in response to the input and output signals to perform at least one of:
matching and converting the input and output signals to directly control the vehicle electronic element:
bypassing the input and output signals; and
overriding the input and output signals.

12. The method according to claim 11, wherein the drive system state information is an engine speed signal received from at least one vehicle electronic element that senses an engine speed, the reader is an engine speed data reader configured to read the engine speed signal, wherein the engine speed signal includes a digital code, and the engine speed data reader reads the digital code and converts the digital code into a pulse-type tachometer emulation signal for the remote start controller.

13. The method according to claim 12, wherein the remote start controller starts the engine based on an engine start output value when the at least one output value includes the engine start output value based on the pulse-type tachometer emulation signal or the digital code reaching an engine start threshold value within a range corresponding to engine revolution of 50 to 1,000 per minute, and stops the engine based on an engine overspeed output value when the at least one output value includes the engine start output value based on the pulse-type tachometer emulation signal or the digital code reaching an engine overspeed threshold value corresponding to engine revolution of 2,500 or more per minute.

14. The method according to claim 11, wherein the drive system state information is an engine speed signal received from at least one vehicle electronic element that senses an engine speed, the reader is an engine speed data reader configured to read the engine speed signal, the engine speed signal includes a digital code, and the engine speed data reader reads the digital code and converts the digital code into at least one output value for the remote start controller.

15. The method according to claim 11, wherein the remote start controller starts the engine based on an engine start output value when the at least one output value includes the engine start output value based on a pulse-type tachometer emulation signal or the digital code reaching an engine start threshold within a range corresponding to engine revolution of 50 to 1,000 per minute, and stops the engine based on an engine overspeed output value when the at least one output value includes the engine start output value based on the pulse-type tachometer emulation signal or the digital code reaching an engine overspeed threshold value corresponding to engine revolution of 2,500 or more per minute.

16. The method according to claim 11, wherein at the step of determining whether or not to perform remote start, engine start is controlled by further combining a virtual signal randomly generated in connection with remote start.

17. The method according to claim 11, wherein the drive system state information is a transmission position data received from at least one vehicle electronic element related to a transmission position, and the remote start module allows engine start only when a transmission is in a preset position, and the preset position is a Park position.

18. The method according to claim 11, wherein the remote start module performs any one among:
 a process of converting a packet transmitted from the vehicle external network into a signal required by the vehicle electronic element in response to the packet and transmitting the signal to the vehicle electronic element so that the vehicle electronic element performs a corresponding operation;
 a process of directly controlling a corresponding vehicle electronic element in response to the packet transmitted from the vehicle external network;
 a process of bypassing input and output packets to the vehicle electronic element or the vehicle external network as they are; or
 a process of ignoring a packet output from the vehicle electronic element and modulating and transmitting a corresponding packet to the vehicle electronic element and the vehicle external network, or deleting a packet input into the vehicle electronic element and modulating and transmitting a corresponding packet to the vehicle electronic element.

19. An Ethernet-based vehicle control method applied to an Ethernet-based vehicle control system comprising a router configured to enable communication between a vehicle internal network and a vehicle external network via a third-party module wherein, the third party-module is configured to be installed on a vehicle to control the vehicle internal network, wherein the vehicle internal network is formed by connecting an engine and a vehicle electronic element including a controller and a first sensor, the method comprising the steps of:
 initializing a remote start using a remote start module that is configured to remote start the engine as the third-party module, wherein the remote start module comprises:
  a remote start receiver for receiving a remote start signal transmitted from a remote controller through the vehicle external network; and
  a remote start controller for controlling engine start by a transmission position data received from at least one vehicle electronic element related to a transmission position among the drive system state information, the remote start signal, and a virtual signal randomly generated in connection with remote start;
 transmitting the drive system state information generated by the vehicle electronic element to the router via the third-party module in response to a drive system state detected by the sensor in the vehicle electronic element;
 reading the drive system state information from a reader connected to the router; and
 performing remote start by the remote start module in response to the remote start signal transmitted from the remote controller through the vehicle external network, wherein whether or not to perform the remote start is determined based on the drive system state information generated by the vehicle electronic element and transferred via the router, wherein,
  the remote start controller allows engine start only when a transmission is in a preset position, and the preset position is a Park position; and
 performing the remote start by the remote start module comprises the steps of:
  controlling the third-party module by the remote controller through the vehicle external network, wherein the remote controller is configured to send and receive input and output signals respectively to the vehicle electronic element via the third-party module, wherein the third-party module is configured to clone a Media Access Control (MAC) Address of the vehicle electronic element in response to the input and output signals to perform at least one of:
   matching and converting the input and output signals to directly control the vehicle electronic element;
   bypassing the input and output signals; and
   overriding the input and output signals.

* * * * *